United States Patent [19]
Enami et al.

[11] Patent Number: 5,543,336
[45] Date of Patent: Aug. 6, 1996

[54] REMOVING DAMAGE CAUSED BY PLASMA ETCHING AND HIGH ENERGY IMPLANTATION USING HYDROGEN

[75] Inventors: Hiromichi Enami, Tachikawa; Kiyomi Katsuyama; Masanori Katsuyama, both of Hamura, all of Japan

[73] Assignee: Hitachi, Ltd., Tokyo, Japan

[21] Appl. No.: 348,108

[22] Filed: Nov. 25, 1994

[30] Foreign Application Priority Data

Nov. 30, 1993 [JP] Japan .................................. 5-300397

[51] Int. Cl.⁶ .................................................. H01L 21/266
[52] U.S. Cl. ............................ 437/24; 437/937; 437/939
[58] Field of Search ........................... 437/24, 937, 939; 148/DIG. 131

[56] References Cited

U.S. PATENT DOCUMENTS

| | | | |
|---|---|---|---|
| 3,849,204 | 11/1974 | Fowler | 437/937 |
| 4,331,486 | 5/1982 | Chenevas-Paule et al. | 437/937 |
| 4,861,424 | 8/1989 | Fujimura et al. | 204/192.35 |

FOREIGN PATENT DOCUMENTS

| | | |
|---|---|---|
| 53-52532 | 5/1978 | Japan . |
| 57-118635 | 7/1982 | Japan . |
| 58-137218 | 8/1983 | Japan . |
| 59-143318 | 8/1984 | Japan . |
| 61-35525 | 2/1986 | Japan . |
| 3-120725 | 5/1991 | Japan . |
| 4-355924 | 12/1992 | Japan . |

OTHER PUBLICATIONS

Sze, "VLSI Technology", pp. 334–337 (no date).
Ashok, "Silicon Surface Damage Phenomena Due to Ion--Assisted Processing," Proc. of the 8th Symp. on Plasma Processing, (1990), pp. 254–284.

Chu et al., "Silicon Damage Caused by Hydrogen Containing Plasmas," Proc. of the 3rd Symp. on Plasma Processing, (1982), pp. 3–13.

Pang et al., "The of Effect Chamber Config. & Bias Voltage on Damage Induced in Si by Reactive Ion Etching," Proc. of 4th Symp., (1983), pp. 84–92.

Arikado et al., "Influence of Magnetic Field on the Gate Oxide Breakdown Phen. During RIE," 8th Intl. Symp. on Plasma Chem., (1987–1989), pp. 979–984.

Ransom et al., "Short–Time Annealing of Dry–Etching Damage," Proc. of 5th Symp. Plasma Processing, (1985), pp. 579–586.

Primary Examiner—Chandra Chaudhari
Attorney, Agent, or Firm—Antonelli, Terry, Stout & Kraus

[57] ABSTRACT

A chamber 103 for introducing hydrogen without causing serious damage to a semiconductor wafer and a chamber 104 for eliminating the hydrogen introduced into the semiconductor wafer at relatively low temperature are installed at the succeeding stage of a plasma etching unit for effectively correcting the damage caused by plasma etching and ion implantation to a semiconductor substrate or an ion implanting unit. In order to introduce hydrogen into the semiconductor wafer without serious damage, a mixture of hydrocarbon gas and oxygen gas for accelerating the decomposition of the hydrocarbon gas is used for forming hydrogen radicals in a plasma and the hydrogen radicals are supplied to the semiconductor wafer at room temperature by a downstream system. The semiconductor wafer is heat-treated in an atmosphere of a vacuum or inactive gas in a temperature region of 200°–500° C. to eliminate the hydrogen introduced into the semiconductor wafer.

17 Claims, 16 Drawing Sheets

REMOVING DAMAGE CAUSED BY PLASMA ETCHING AND HIGH ENERGY IMPLANTATION USING HYDROGEN

BACKGROUND OF THE INVENTION

The present invention relates to semiconductor integrated circuit technology and more particularly to the technique of removing the damage caused to a semiconductor substrate by plasma etching and high-energy ion implantation.

During the process of manufacturing VLSIs, there has been a serious problem that element characteristics are badly affected by the damage caused to silicon substrates by plasma etching and ion implantation. Reports that have heretofore been presented for damage of the sort mentioned above are as follows:

Irradiation Damage

"VLSI TECHNOLOGY" (Edited by Sze, McGROW HILL) pp.335–336, "SEMICONDUCTOR DRY ETCHING TECHNIQUE" (Edited by Tokuyama, Sangyo Tosho) pp.382, "Silicon Surface Damage Phenomena due to Ion Assisted Processing" (Proceedings of the Eighth Symposium on PLASMA PROCESSING (1990) pp.254–284 have discussed the bad influences of particles of such as ions, radicals, photons and so forth in plasmas on element characteristics.

Hydrogen Damage

"Silicon Damage Caused by Hydrogen Containing Plasmas" (Proceedings of the Third Symposium on PLASMA PROCESSING (1982) pp.3 to 13 has pointed out that hydrogen atoms contained in processing gases infiltrate into substrates to the depth of the order of microns during plasma processing and thus badly affect them, for instance, induce crystalline defects.

Heavy Metal Contamination

"The Effect of Chamber Configuration and Bias Voltage on Damage Induced in Si by Reactive Ion Etching" (Proceedings of the Fourth Symposium on PLASMA PROCESSING (1983) pp.84–92 has pointed out that heavy metals derived from processing gases and component materials of vacuum processing chambers adhere to the wafer surfaces or infiltrate into the wafers and thus badly affect element characteristics.

Charge-up Damage

"Influence of Magnetic Field on the Gate Oxide Breakdown Phenomenon during Reactive Ion Etching" (8th International Symposium on PLASMA CHEMISTRY (1987–1989) pp.979 has pointed out that charge is accumulated on wafer surfaces during plasma processing and causes electrical damage to gate oxide films.

On the other hand, the following techniques have been proposed to repair the damage caused thereby.

"Short Time Annealing of DRY-ETCHING Damage" (Proceedings of the Fifth Symposium on PLASMA PROCESSING (1985)) pp.579–586 discloses an etching damage recovery technique by short time annealing.

Japanese Patent Laid-Open No. 52532/1978 discloses, in connection with the removal of minute defects and stacking faults within silicon substrates and the stabilization of the interface state of the oxide film/substrate interface, a technique of performing an oxygen or water vapor annealing process in a relatively high temperature region of approximately 1,000° C., process by process.

Japanese Patent Laid-Open No. 118635/1982 and No. 137218/1983 disclose a technique of performing a long time oxygen annealing process in an intermediate temperature region of approximately 400° C. before and after the formation of a device.

Japanese Patent Laid-Open No. 143318/1984 discloses a technique of introducing hydrogen into a silicon substrate heated to approximately 200° C. by UV irradiation in an atmosphere containing hydrogen gas, and a technique of processing a silicon substrate placed in a hydrogen plasma at the normal temperature to 50° C.

Japanese Patent Laid-Open No. 35525/1986 discloses a technique of processing a silicon substrate placed in a hydrogen atmosphere at 800°–1,000° C.

Japanese Patent Laid-Open No. 120725/1991 discloses a technique of processing a polycrystalline/amorphous silicon film on a silicon substrate at 250°–500° C.

Japanese Patent Laid-Open No. 355924/1992 discloses a technique of modifying an oxide film deposited by sputtering in a hydrogen atmosphere.

SUMMARY OF THE INVENTION

The aforesaid techniques of removing damage are effective in a case where the base/emitter layer of a transistor is as relatively thick as above 0.2 μm and the scale of integration is not so large. As three-dimensional device structure have dominated and the scale of integration of the device has increased, however, greater stress is generated in the silicon substrate and in the thin films deposited thereon, and the stresses tend to concentrate locally. As a result, the defect developed along the stress is hard to remove as the substrate is subjected to processes.

Moreover, diffusion layers such as of the base/emitter layer tend to be thinner as devices operate at high speeds. In order to avoid variation in the device characteristics resulting from thinning diffusion layers, the heat treatment for moving impurities in the diffusion layer needs reducing as much as possible, thereby suppressing the thermal budget.

In putting all accounts together, it is necessary to remove damage under a heat treatment condition of relatively low temperature where impurities in the diffusion layer do not move for every process where silicon substrates and thin films thereon may be damaged in the manufacture of future VLSI. In order to deal with the complicated device structure, such damage also needs removing in as short a time as possible.

An object of the present invention is to provide semiconductor integrated circuit technology capable of effectively removing damage caused to a semiconductor substrate by plasma etching and ion implantation.

These and other objects and novel features of the invention will become more apparent in the detailed description taken in connection with the accompanying drawings.

A brief description will subsequently be given of the preferred embodiments of the present invention disclosed in this patent application.

(1) A process for producing semiconductor devices as claimed in claim 1 comprises the steps of introducing hydrogen into a semiconductor wafer without causing serious damage thereto, and eliminating the hydrogen thus introduced into the semiconductor wafer at relatively low temperature.

(2) A process for producing semiconductor devices as claimed in claim 2, wherein the step of introducing hydrogen into the semiconductor wafer is to supply hydrogen radicals in a plasma to a semiconductor wafer at room temperature by a downstream system.

(3) A process for producing semiconductor devices as claimed in claim 3, wherein hydrogen radicals are produced in a plasma using a mixture of hydrocarbon gas and oxygen gas for accelerating the decomposition of the hydrocarbon gas.

(4) A process for producing semiconductor devices as claimed in claim 4 comprises the step of eliminating the hydrogen introduced into the semiconductor wafer by heat-treating the semiconductor wafer in an atmosphere of inactive gas in a temperature region of 200°–500° C.

(5) A process for producing semiconductor devices as claimed in claim 5, wherein the step of eliminating the hydrogen introduced into the semiconductor wafer is to heat-treat the semiconductor wafer in a vacuum in a temperature region of 200°–500° C.

(6) A process for producing semiconductor devices as claimed in claim 6, wherein the semiconductor wafer is irradiated with ultraviolet rays to accelerate the elimination of hydrogen when the hydrogen introduced into the semiconductor wafer is eliminated.

(7) A process for producing semiconductor devices as claimed in claim 7 comprises the steps of implanting accelerated impurity ions into a semiconductor wafer, introducing hydrogen into the semiconductor wafer without causing serious damage thereto, and eliminating the hydrogen introduced into the semiconductor wafer at relatively low temperature in succession.

(8) A process for producing semiconductor devices as claimed in claim 8, wherein contaminating substances adhering to the semiconductor wafer during the process are removed by wet-rinsing the semiconductor wafer after the ion implantation step.

(9) A process for producing semiconductor devices as claimed in claim 9, wherein when a photoresist mask is used at the step of implanting ions, the photoresist mask is removed by plasma ashing by a downstream system after the ions have thus been implanted.

(10) A process for producing semiconductor devices as claimed in claim 10 comprises the steps of plasma etching using a processing gas containing hydrogen, and eliminating the hydrogen introduced into the semiconductor wafer at relatively low temperature in succession.

(11) A process for producing semiconductor devices as claimed in claim 11, wherein contaminating substances adhering to the semiconductor wafer during the process are removed by wet-rinsing the semiconductor wafer after the plasma etching step.

(12) A process for producing semiconductor devices as claimed in claim 12, wherein when a photoresist mask is used at the step of plasma etching, the photoresist mask is removed by plasma ashing by a downstream system after the plasma etching step.

(13) A process for producing semiconductor devices as claimed in claim 13 comprises the steps of plasma etching, using a processing gas except hydrogen, introducing hydrogen into a semiconductor wafer without causing serious damage thereto, and eliminating the hydrogen introduced into the semiconductor wafer at relatively low temperature in succession.

(14) An apparatus for producing semiconductor devices as claimed in claim 14 comprises a chamber for introducing hydrogen into a semiconductor wafer without causing serious damage thereto, and a chamber for eliminating the hydrogen introduced into the semiconductor wafer at relatively low temperature.

(15) An apparatus for producing semiconductor devices as claimed in claim 15, wherein the chamber for introducing hydrogen is provided with plasma forming means, and means for supplying radical species in a plasma to the semiconductor wafer by a downstream system.

(16) An apparatus for producing semiconductor devices as claimed in claim 16, wherein the chamber for introducing hydrogen is provided with means for heating the semiconductor wafer in a temperature region of 200°–500° C.

(17) An apparatus for producing semiconductor devices as claimed in claim 17, comprising a chamber for introducing hydrogen into the semiconductor wafer without causing serious damage thereto at the succeeding stage of an ion implanting unit, and a chamber for eliminating the hydrogen introduced into the semiconductor wafer at relatively low temperature.

(18) An apparatus for producing semiconductor devices as claimed in claim 18, comprising a chamber for introducing hydrogen into the semiconductor wafer without causing serious damage thereto at the succeeding stage of a plasma etching unit, and a chamber for eliminating the hydrogen introduced into the semiconductor wafer at relatively low temperature.

(19) An apparatus for producing semiconductor devices as claimed in claim 19, comprising means for wet-rinsing the semiconductor wafer at the preceding stage of the chamber for eliminating hydrogen.

(20) An apparatus for producing semiconductor devices as claimed in claim 20, comprising a plasma ashing unit of a downstream system at the preceding stage of the chamber for eliminating hydrogen.

At the step of plasma-etching an oxide silicon film, using a processing gas containing hydrogen, etching using ions accelerated by energy of as high as about 100–1000 eV progresses. At this time, the accelerated ions remove the oxide silicon film of the portion required, infiltrate into the silicon substrate, causing various damages as noted previously.

These damages can broadly be classified into two categories: change of the surface of the silicon substrate to an amorphous state; contamination resulting from that the material of the processing chamber sputtered by the accelerated ions adhere to the surface of the silicon substrate and diffuse into the silicon substrate; and defects resulting from that hydrogen atoms contained in the processing gas are activated, enter deeply the silicon substrate and gather in the substrate.

When the plasma etching is carried out by using a photoresist mask, the photoresist mask is first removed by downstream type plasma ashing, according to the present invention. When contaminating material which may badly affect the device characteristics still adhere the silicon substrate, the contaminating material is first removed by using acid or alkaline rinsing liquid and the silicon substrate is annealed in an atmosphere of inactive gas or in a vacuum in a relatively low temperature region of 200°–500° C. so as to eliminate hydrogen that has infiltrated into the substrate.

With respect to the damage caused at the plasma-etching or the ion implanting step using a processing gas containing no hydrogen, the processing gas containing hydrogen is first decomposed by a plasma and hydrogen is supplied into the silicon substrate placed at room temperature during afterglow/downstream.

There is a known method of supplying hydrogen to a silicon substrate by annealing the substrate in an atmosphere of hydrogen gas, it must be implemented under a temperature condition of approximately 500° C. In the case of hydrogen radicals obtainable by plasma decomposition of hydrogen, however, hydrogen radicals can infiltrate into the substrate at room temperature.

When hydrogen is supplied at room temperature, the hydrogen is hardly eliminated from the substrate because the substrate temperature after the treatment is low. It is therefore possible to control the concentration of hydrogen in the substrate with a high accuracy. Moreover, the hydrogen having infiltrated into the substrate is concentrated in the substrate and produces minute point defects. Because of this defective state, the crystallinity of the silicon substrate is deteriorated, the carrier life is shortened.

When a photoresist mask is used for plasma etching and ion implantation as in the preceding case, moreover, the photoresist mask is removed by downstream type plasma ashing, and when contaminating material which may badly affect the device characteristics still exist, the contaminating material is first removed by acid or alkaline rinsing liquid and the silicon substrate is annealed in an atmosphere of inactive gas or a vacuum in a relatively low temperature region of 200°–500° C. so as to eliminate the hydrogen in the substrate.

When this process is performed, hydrogen in the substrate is activated and moved from a relative low temperature region of 100°–200° C. first, and the recovery of not only crystallinity but also interface state begin to take place. When the low-temperature annealing is continued, the hydrogen in the substrate is completely eliminated and the defects that have existed in the substrate before the supply of hydrogen are corrected and the carrier life is prolonged.

DETAILED DESCRIPTION OF THE INVENTION

Figure 1:
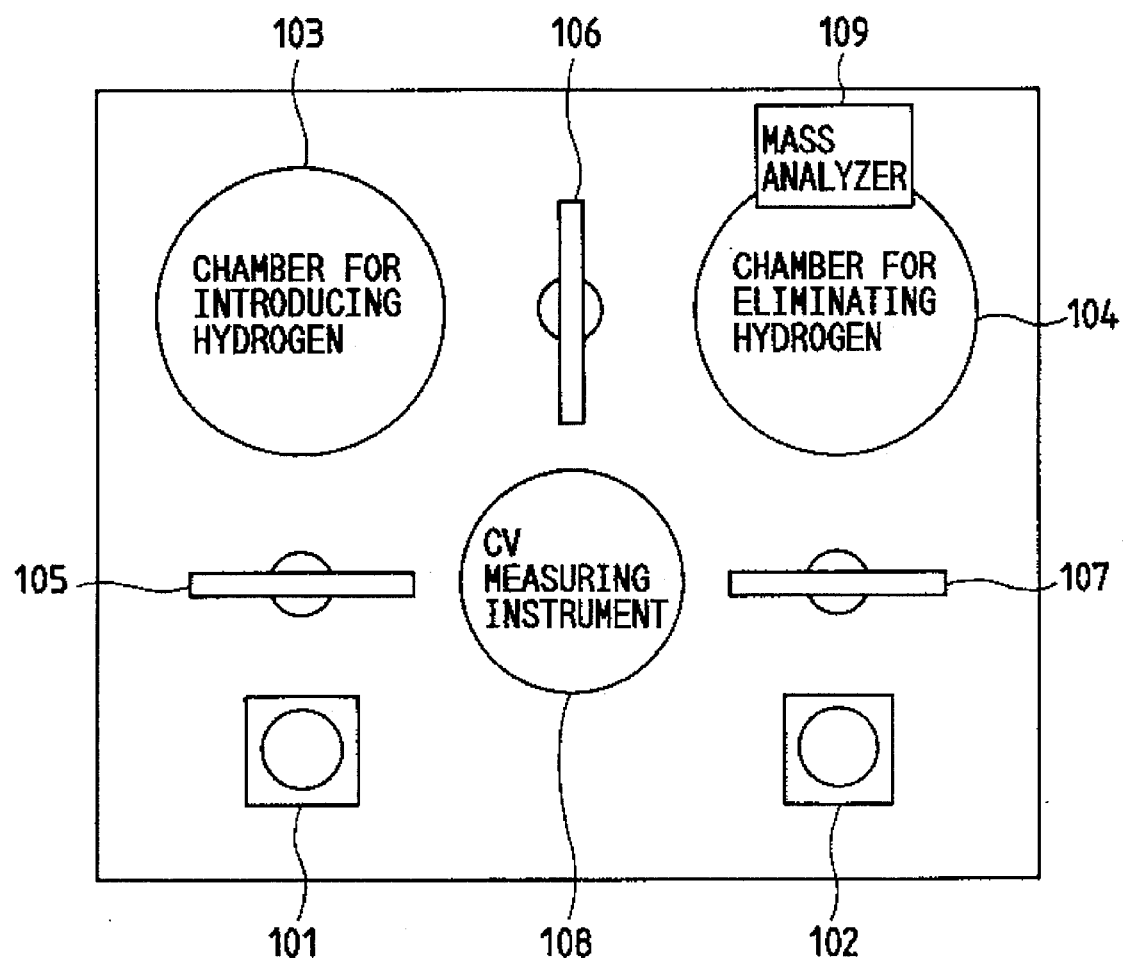
FIG. 1 is an overall block diagram of an apparatus for manufacturing semiconductors according to the present invention.

Referring to the drawings, a detailed description will subsequently be given of embodiments of the present invention.

Embodiment 1

FIG. 1 is an overall block diagram of an apparatus for manufacturing semiconductors.

The manufacturing apparatus is of a single wafer processing type which is designed for semiconductor wafers to be processed one by one. The manufacturing apparatus comprises, as shown in FIG. 1, a load cassette 101, an unload cassette 102, a chamber for introducing hydrogen 103, a chamber for eliminating hydrogen 104, wafer conveying robot arms 105, 106, 107, and a non-contact CV measuring instrument 108 for monitoring the quantities of hydrogen introduced and eliminated. The chamber for eliminating hydrogen 104 is further equipped with a mass analyzer 109 for monitoring the quantity of hydrogen eliminated from a semiconductor wafer.

Figure 2:
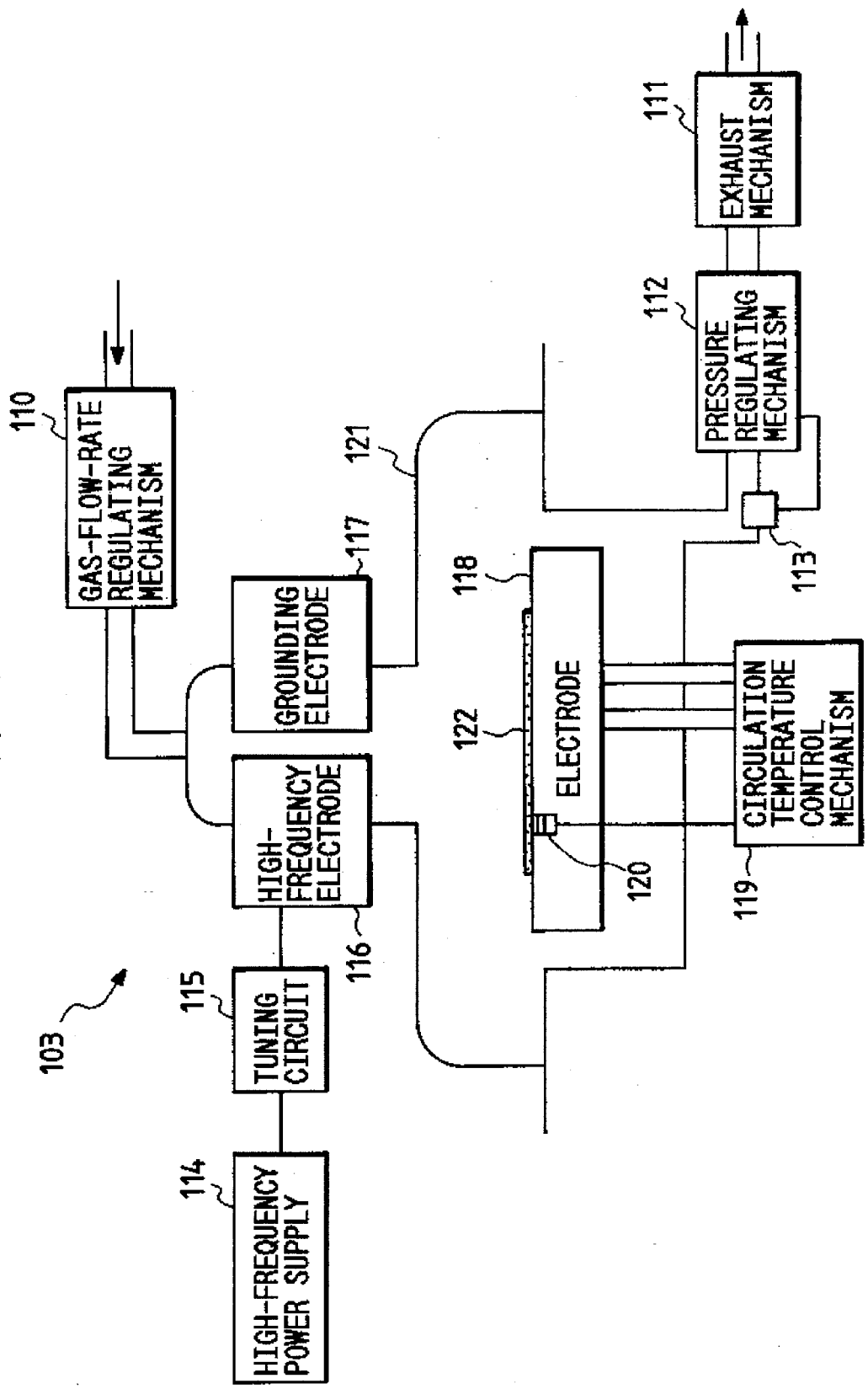
FIG. 2 is an overall block diagram of a chamber for introducing hydrogen.

FIG. 2 is an overall block diagram of the chamber for introducing hydrogen 103. The chamber for introducing hydrogen 103 comprises a gas-flow-rate regulating mechanism 110 for regulating the flow rate of a processing gas to be introduced into the chamber, an exhaust mechanism 111 for evacuating the chamber by exhausting the processing gas and the air introduced into the chamber, a pressure regulating mechanism 112 for holding the atmospheric pressure in the chamber at an optimum value, a pressure monitor 113 for monitoring the atmospheric pressure in the chamber, a high-frequency power supply 114 for supplying high-frequency power for use in forming a plasma in the chamber, a tuning circuit 115, a high-frequency electrode 116, a grounding electrode 117, an electrode 118 on which a semiconductor wafer 122 is placed, a circulation temperature control mechanism 119 for regulating the temperature of the electrode 118, a temperature monitor 120 for monitoring the temperature of the semiconductor wafer 122, and a quartz bell-jar 121 forming the wall surface of the chamber.

The manufacturing apparatus employs a downstream system in which the electrode 118 is located on the downstream side of the plasma in order to avoid damage on the semiconductor wafer 122 from the plasma. In other words, the processing gas is excited by the high-frequency electrode 116 and the grounding electrode 117 when the processing gas is introduced into the chamber of this apparatus, and a plasma is generated in a region above the electrode 118, whereby only long-life radicals are caused to flow down onto the surface of the semiconductor wafer 122.

Figure 3:
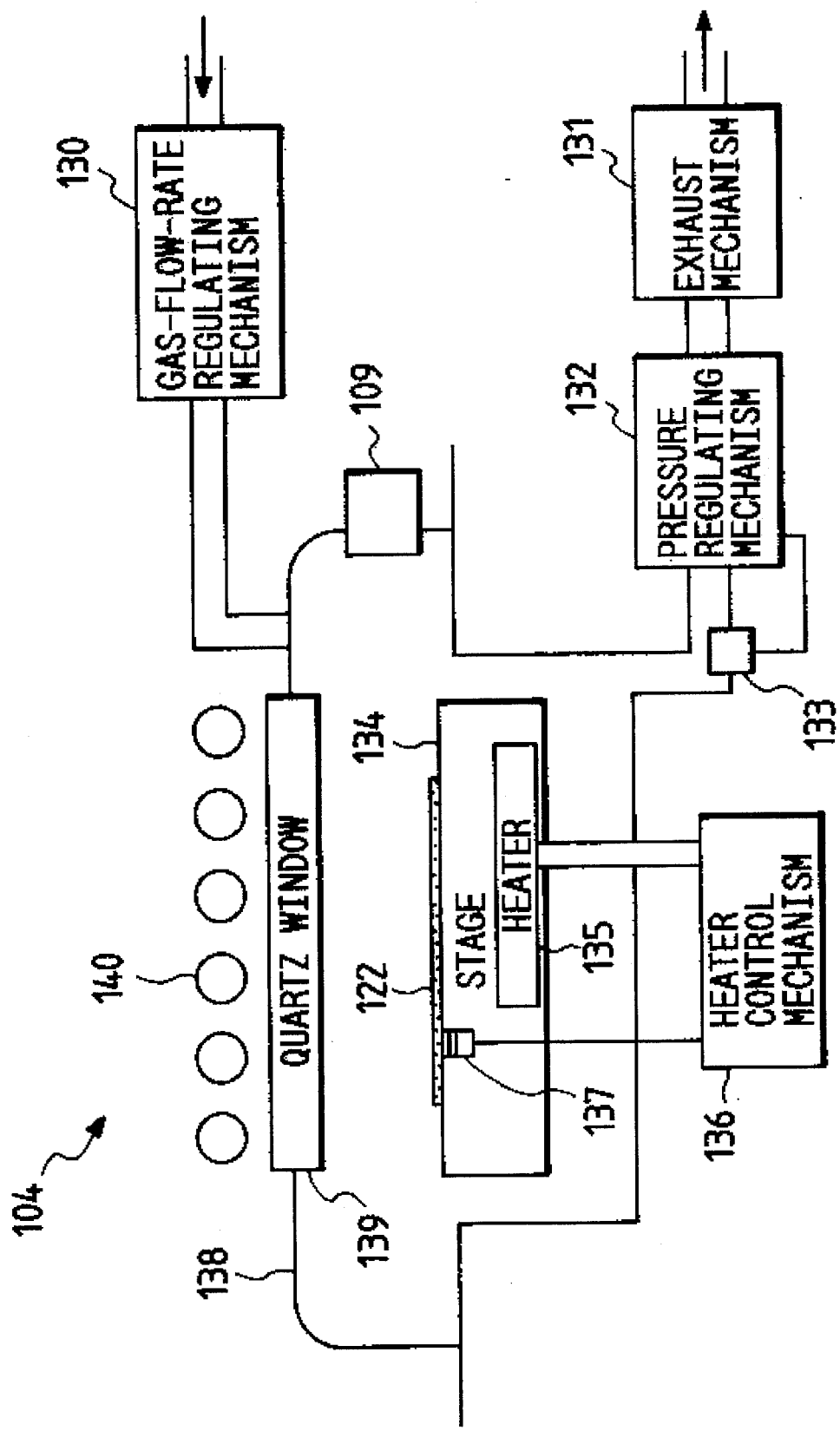
FIG. 3 is an overall block diagram of a chamber for eliminating hydrogen.

FIG. 3 is an overall block diagram of the chamber 104 for eliminating hydrogen. The chamber 104 for eliminating hydrogen comprises a gas-flow-rate regulating mechanism 130 for regulating the flow rate of a processing gas to be introduced into the chamber, an exhaust mechanism 131 for evacuating the chamber by exhausting the processing gas and the air introduced into the chamber, a pressure regulating mechanism 132 for holding the atmospheric pressure in the chamber at an optimum value, a pressure monitor 133 for monitoring the atmospheric pressure in the chamber, a stage 134 on which the semiconductor wafer 122 is placed, a heater 135 for heating the stage 134, a heater control mechanism 136 for regulating the temperature of the heater 135, a temperature monitor 137 for monitoring the temperature of the semiconductor wafer 122, a mass analyzer 109 for monitoring the quantity of hydrogen eliminated from the semiconductor wafer 122, and a quartz bell-jar 138 forming the wall surface of the chamber. There are also provided UV lamps 140 for causing the hydrogen to be efficiently eliminated from the semiconductor wafer 122 above a quartz window 139 located above the quartz bell-jar 138.

Figure 4:
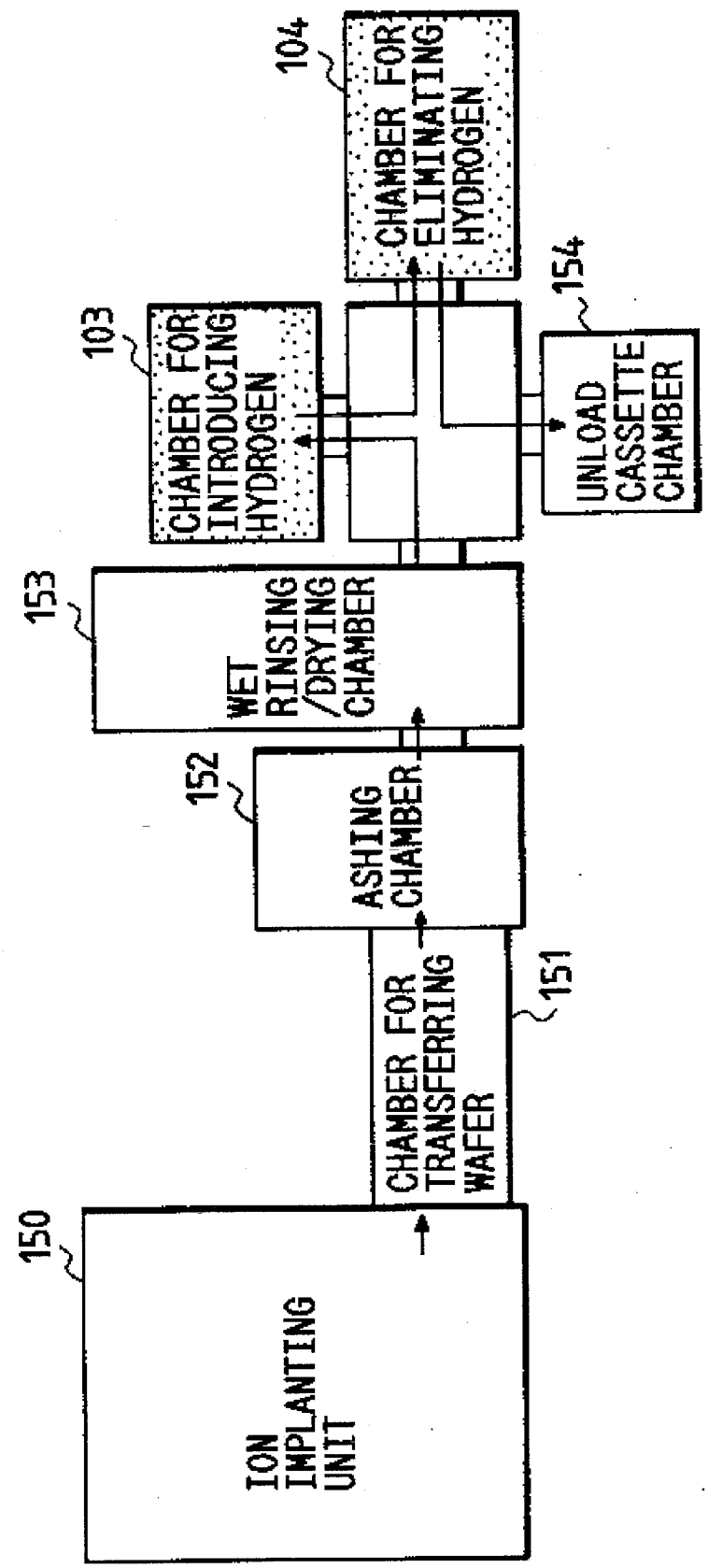
FIG. 4 is an overall block diagram of an example of an apparatus in which an apparatus for manufacturing semiconductors of the present invention is connected to the succeeding stage of an ion implanting unit.

FIG. 4 is an overall block diagram of an example of an apparatus in which an manufacturing apparatus according to the present invention which is connected to the succeeding stage of an ion implanting unit.

This apparatus comprises an ion implanting unit 150, a chamber for transferring wafers 151, an ashing chamber 152 for removing the photoresist used as a mask for ion implantation, a wet rinsing/drying chamber 153 for removing contaminating substances such as heavy metals adhering to the surface of the wafer, the chamber 103 for introducing hydrogen, the chamber 104 for eliminating hydrogen, and an unload cassette chamber 154. The ion implanting unit 150 has a known structure, and the ashing chamber 152 is equipped with a downstream type plasma ashing unit.

A description will subsequently be given of the process of removing the damage caused to a semiconductor wafer.

Figure 5:
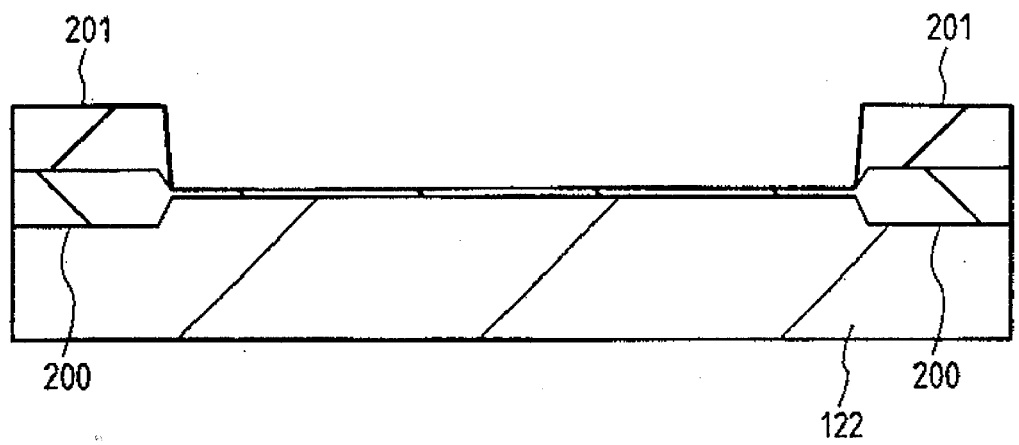
FIG. 5 is a sectional view of a principal part of a semiconductor wafer, illustrating a process for manufacturing semiconductors of an embodiment of the present invention.

A semiconductor wafer 122 as shown in FIG. 5 is first prepared. The semiconductor wafer 122 is formed of a single crystal of p-type silicon, on which are formed a field insulating film 200 by LOCOS (selective oxidation) and a photoresist 201 as a mask for ion implantation.

Figure 6:
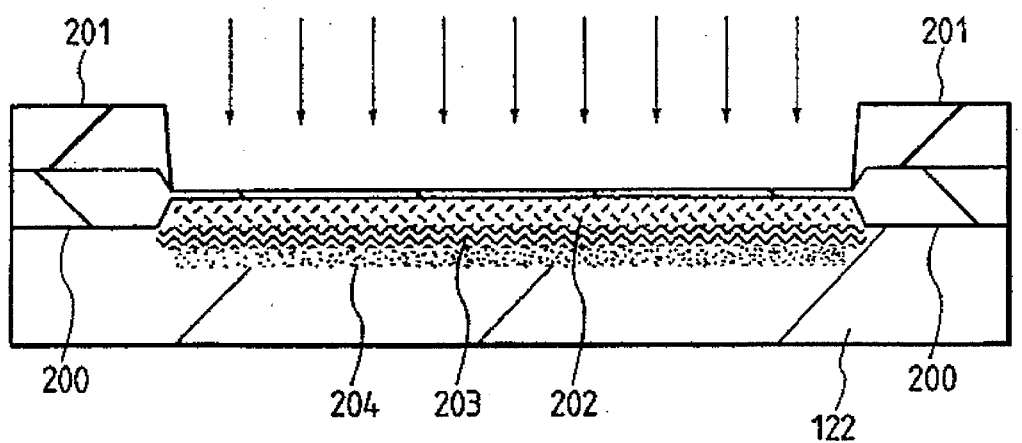
FIG. 6 is a sectional view of a principal part of a semiconductor wafer, illustrating a process for manufacturing semiconductors of an embodiment of the present invention.

Subsequently, the semiconductor wafer 122 is transferred to the ion implanting unit 150 where impurity ions are implanted by a conventional technique. By way of example, phosphorus (P) is employed as impurity ionic species the implanting energy is 60 eV and the dose is $1 \times 10^{14}/cm^2$ (the annealing technique according to the present invention is particularly effective in the case of ion implantation of a concentration high than $1.0 \times 10^{13}/cm^2$. In the case of a DRAM as will be described below, for example, it is effective in doping a high-concentration region of the source or drain). As shown in FIG. 6, ion implantion with such a high energy forms an amorphous layer 202, a crystal-defect generation layer 203 and an impurity-ion layer 204 in this order in the semiconductor wafer 122. Therefore, if impurities are diffused in that condition, dependence of the diffusion distance on the amorphous layer and the crystal-defect generation layer occurs. Incidentally, the amorphous layer 202, the crystal-defect generation layer 203 and the impurity-ion layer 204 are not distinctly isolated from one another in the semiconductor wafer 122 but provided in an overlapped state.

Subsequently, the semiconductor wafer 122 is transferred to the ashing chamber 152 where the photoresist 201 is removed and it is then transferred to the wet rinsing/drying chamber 153 where contaminating substances such as heavy metals adhering to the surface of the semiconductor wafer 122 are removed with an acid or alkaline rinsing liquid before transferred to the chamber 103 for introducing hydrogen.

While the semiconductor wafer 122 is mounted on the electrode 118, the exhaust mechanism 111 is used to evacuate the chamber up to approximately 1 mTorr once before the processing gas at a predetermined pressure is introduced into the chamber by means of the gas-flow-rate regulating mechanism 110 and the pressure regulating mechanism 112. When the high-frequency power generated by the high-frequency power supply 114 is supplied via the tuning circuit 115 to the high-frequency electrode 116, the processing gas is excited between the high-frequency electrode 116 and the grounding electrode 117 and a plasma is generated, whereby only long-life hydrogen radicals are transported onto the surface of the semiconductor wafer 122 and introduced into the semiconductor wafer 122 with slight damage. At this time, the semiconductor wafer 122 is kept at a predetermined temperature by the circulation temperature control mechanism 119 and the temperature monitor 120.

The process of introducing hydrogen is performed under the following condition in this embodiment of the invention.
Processing gas: $CHF_3+O_2$
Flow rate of gas: $CHF_3$=20 sccm, $O_2$=400 sccm
Processing pressure: 1.5 Torr
RF frequency: 13.56 MHz
RF power: 400 W
Electrode temperature: 25° C.
Processing time: 5 min.

A purging gas such as N gas is then introduced via the gas-flow-rate regulating mechanism 110 into the chamber after the process of introducing hydrogen is thus completed. The purging gas is supplied until the pressure inside the chamber becomes equal to the atmospheric pressure.

The semiconductor wafer 122 is then conveyed to the CV measuring instrument 108 where the quantity of hydrogen thus introduced is measured, and conveyed to the chamber 104 for eliminating hydrogen. While the semiconductor wafer 122 is placed on the stage 134, the exhaust mechanism 131 evacuates the chamber up to approximately 0.1 Torr once and an inactive gas at a predetermined pressure is introduced into the chamber by means of the gas-flow-rate regulating mechanism 130 and the pressure regulating mechanism 132. At this time, the power controlled by the heater control mechanism 136 and the temperature monitor 137 is supplied to the heater 135 to maintain the semiconductor wafer 122 at a predetermined temperature so as to eliminate hydrogen. When hydrogen is eliminated slowly, the rate of elimination may be accelerated by projecting light of the UV lamps 140 via the quartz window 139 onto the surface of the semiconductor wafer 122. The quantity of hydrogen eliminated from the semiconductor wafer 122 is measured by the mass analyzer 109.

The process of eliminating hydrogen is performed under the following condition in this embodiment.
Inactive gas: $N_2$
Flow rate of gas: 100 sccm
Processing pressure: 10 Torr
Stage temperature: 300° C.
Processing time: 5 min.

Figure 7:
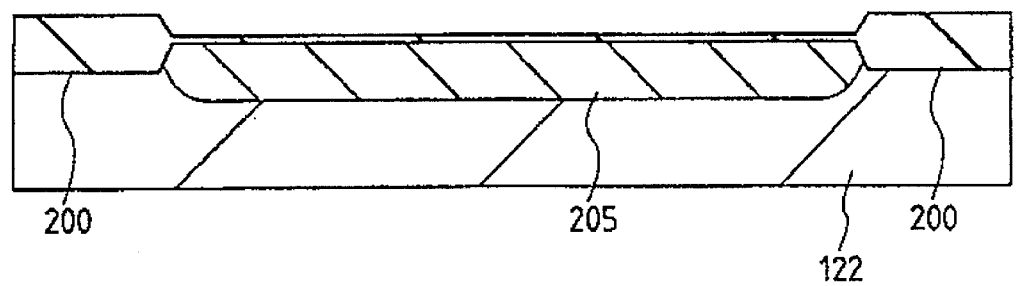
FIG. 7 is a sectional view of a principal part of a semiconductor wafer, illustrating a process for manufacturing semiconductors of an embodiment of the present invention.

A purging gas at the same pressure as the atmospheric pressure is introduced via the gas-flow-rate regulating mechanism 130 into the chamber after the completion of the hydrogen eliminating process. The semiconductor wafer 122 whose damage has been corrected is accommodated in the unload cassette chamber 154 once and then conveyed to the impurity diffusion process. FIG. 7 is a sectional view of the semiconductor wafer 122, showing that the damage has been corrected by the hydrogen introduction/elimination process and that an ideal diffusion layer 205 has been formed.

Embodiment 2

Figure 8:
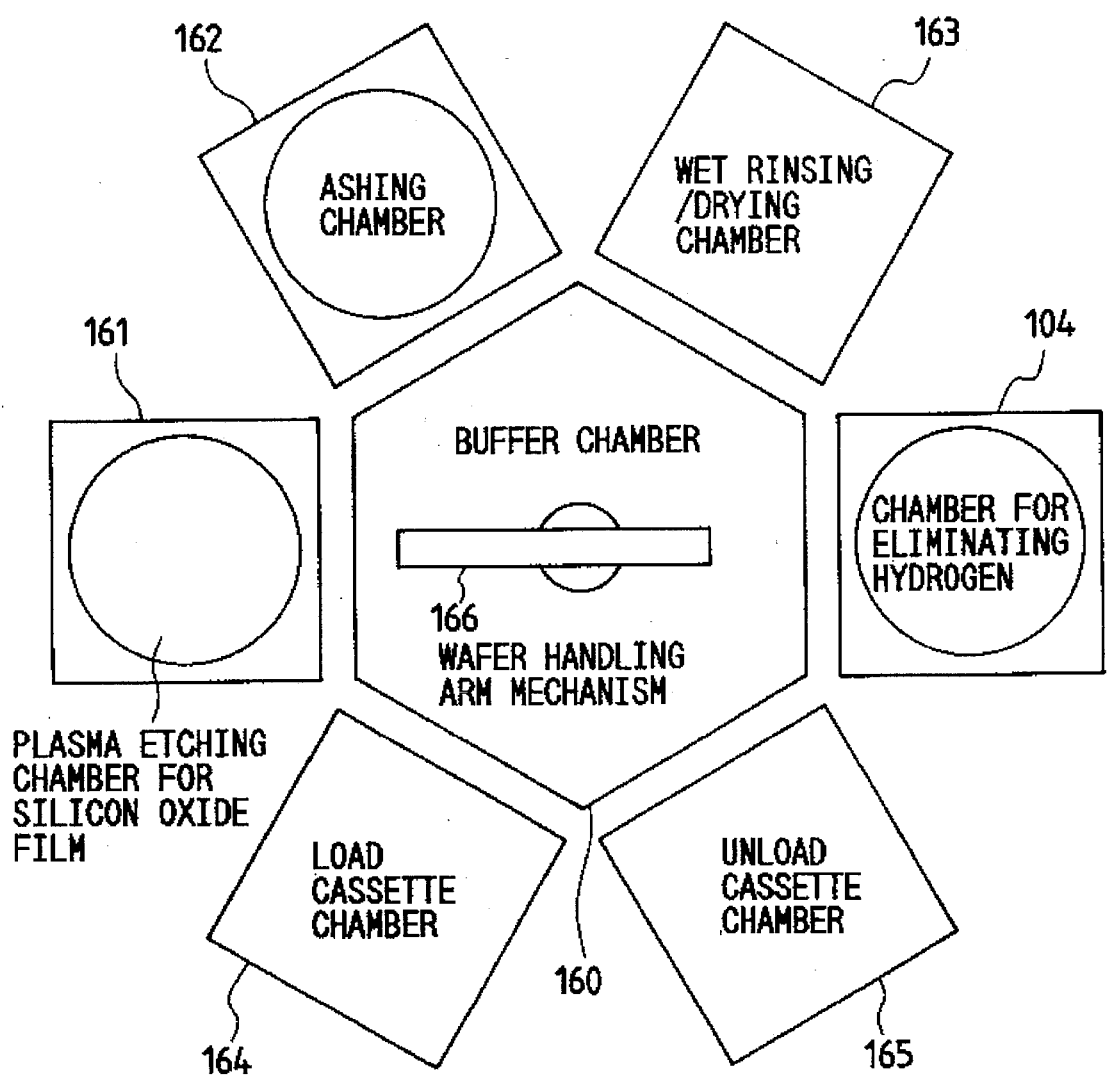
FIG. 8 is an overall block diagram of an example of an apparatus in which an apparatus for manufacturing semiconductors is combined with a dry etching unit.

FIG. 8 is a block diagram of an example of an apparatus in which the manufacturing apparatus shown in FIGS. 1–3 is combined with a dry etching unit.

This apparatus comprises a plasma-etching chamber 161 for processing an silicon oxide film around a buffer chamber 160, an ashing chamber 162 (or a chamber for introducing hydrogen) for removing a photoresist used as an etching mask and introducing hydrogen when necessary as noted previously, a wet-rinsing/drying chamber 163 for removing contaminating substances adhering to the surface of a wafer, a chamber 104 for eliminating hydrogen, a load cassette chamber 164, and an unload cassette chamber 165. The semiconductor wafer is conveyed to each chamber via a wafer handling arm mechanism 166 of the buffer chamber 160. The plasma-etching chamber 161 is provided with a microwave (µ) plasma unit of a known structure, a µ-wave ECR plasma-etching unit and so forth.

As a gas containing hydrogen is normally used as a processing gas during the dry-etching process, hydrogen is introduced into the semiconductor wafer at the time of dry etching. Although the chamber for eliminating hydrogen is therefore unnecessary for the apparatus of the embodiment of the invention, a chamber for introducing hydrogen may be installed at the preceding stage of the chamber 104 for eliminating hydrogen when etching is carried out by using a processing gas containing no hydrogen. (In this embodiment of the invention, hydrogen is introduced into the ashing chamber of FIG. 8 after the ashing process is completed therein). Further, hydrogen may be introduced separately when the introduction of hydrogen is insufficient even in a case where processing is carried out using the processing gas containing hydrogen.

A description will subsequently be given of the technique of removing damage, using this apparatus.

Figure 9:
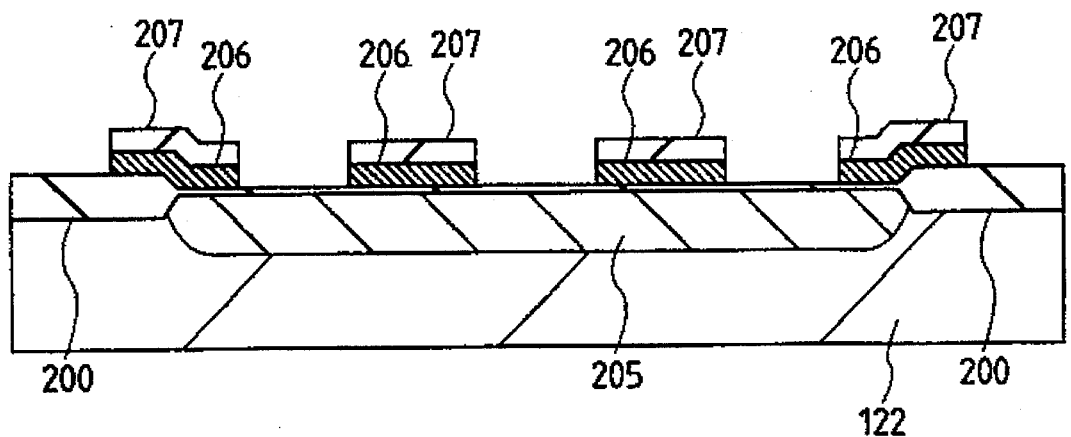
FIG. 9 is a sectional view of a principal part of a semiconductor wafer, illustrating an embodiment of a process for manufacturing a DRAM as an application of the present invention.

First, a semiconductor wafer 122 is prepared as shown in FIG. 9. MISFET poly-Si gate electrodes 206 (may be polysides or silicide gates) have been formed on the surface of the semiconductor wafer 122. The MISFET is, for example, a MISFET for selecting a memory cell in a DRAM. Numeral 200 in FIG. 9 denotes a field insulating film, 205 a diffusion layer, and 207 a silicon oxide film.

The gate electrodes 206 are formed by etching the polycrystalline silicon film deposited by CVD on the semiconductor wafer 122. The etching is carried out under the following condition, for example.
Etching mode: µ-wave ECR system
Processing gas: $Cl_2+O_2$
Flow rate of gas: $Cl_2$=40 sccm, $O_2$=4 sccm
Processing pressure: 5 mTorr
µ wave: 1.0 kW
RF (2 MHz): 10–20 W
Temperature: −50° C.

Next, the semiconductor wafer 122 is conveyed to the ashing chamber 162 where the photoresist is removed and then to the wet rinsing/drying chamber 163 where contaminating substances such as heavy metals adhering to the surface of the semiconductor wafer 122 are removed with an acid or alkaline rinsing liquid, and conveyed to the chamber 162 for introducing hydrogen. (The chamber 162 for introducing hydrogen is substantially similar in structure to the chamber for introducing hydrogen of FIG. 2).

While the semiconductor wafer 122 is mounted on the electrode 118, the exhaust mechanism 111 is used to evacuate the chamber up to approximately 1 mTorr once before the processing gas at a predetermined pressure is introduced into the chamber by means of the gas-flow-rate regulating mechanism 110 and the pressure regulating mechanism 112. When the high-frequency power generated by the high-frequency power supply 114 is supplied via the tuning circuit 115 to the high-frequency electrode 116, the processing gas is excited between the high-frequency electrode 116 and the grounding electrode 117 and a plasma is generated, whereby only long-life hydrogen radicals are transported onto the surface of the semiconductor wafer 122 and introduced into the semiconductor wafer 122 with light damage. At this time, the semiconductor wafer 122 is kept at a predetermined temperature by the circulation temperature control mechanism 119 and the temperature monitor 120.

The process of introducing hydrogen is performed under the following condition of the embodiment.
Processing gas: $CHF_3+O_2$ Flow rate of gas: $CHF_3$=20 sccm, $O_2$=400 sccm
Processing pressure: 1.5 Torr
RF frequency: 13.56 MHz
RF power: 400 W
Electrode temperature: 25° C.
Processing time: 5 min.

The camber is evacuated up by the exhaust mechanism 111 to substantially the same degree as that of the degree of vacuum in the vacuum buffer chamber 160 after the introduction of hydrogen is completed.

Subsequently, the semiconductor wafer 122 is conveyed via the vacuum buffer chamber 160 to the chamber 104 for eliminating hydrogen. (The chamber 104 for eliminating hydrogen is substantially similar in structure to the chamber of FIG. 3). While the semiconductor wafer 122 is placed on the stage 134, the exhaust mechanism 131 first evacuates the chamber up to approximately 0.1 Torr once (if the chamber is in a suitable vacuum, the evacuation is unnecessary), and an inactive gas at a predetermined pressure is introduced into the chamber by means of the gas-flow-rate regulating mechanism 130 and the pressure regulating mechanism 132. At this time, power controlled by the heater control mechanism 136 and the temperature monitor 137 is supplied to the heater 135 to keep the semiconductor wafer 122 at a predetermined temperature so as to eliminate hydrogen. When the rate of elimination of hydrogen is low, the rate of elimination may be accelerated by projecting the light of the UV lamps 140 via the quartz window 139 onto the surface of the semiconductor wafer 122. The quantity of hydrogen eliminated from the semiconductor wafer 122 is measured by the mass analyzer 109 (the measurements are not essential and may be made only when necessary).

The process of eliminating hydrogen is performed under the following condition in this embodiment.
Inactive gas: $N_2$
Flow rate of gas: 100 sccm
Processing pressure: 10 Torr
Stage temperature: 300° C.
Processing time: 5 min.

The pressure in the chamber is set equal to that in the buffer chamber 160 by the exhaust mechanism 131 after the hydrogen eliminating process is completed. The semiconductor wafer 122 the damage of which has been corrected is stored once in the unload cassette chamber 164, and conveyed to the following process.

Figure 10:
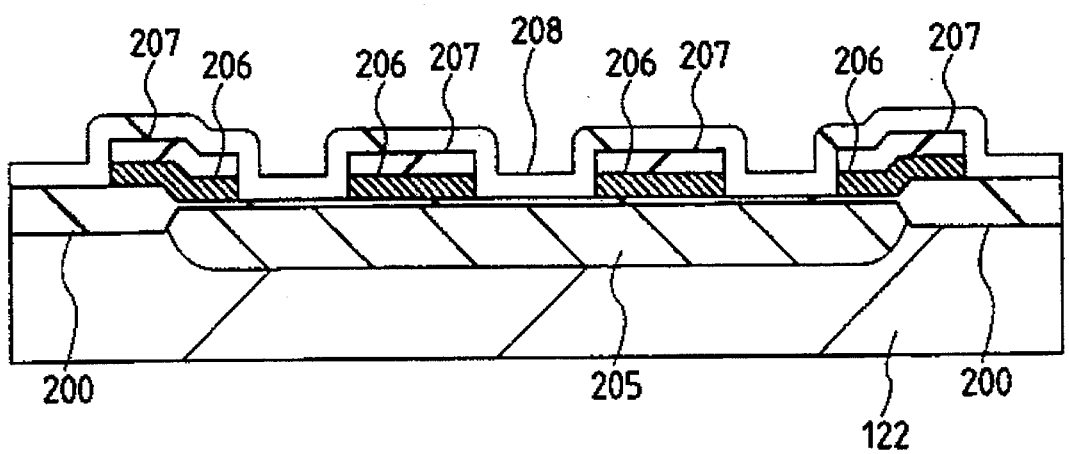
FIG. 10 is a sectional view of a principal part of the semiconductor wafer, illustrating the process for manufacturing a DRAM as an application of the present invention.

As shown in FIG. 10, a silicon oxide film 208 is then formed by CVD on the semiconductor wafer 122, which is conveyed to the plasma-etching chamber 161 of the apparatus according to the present invention. Further, as shown in FIG. 11, side wall spacers 208A are formed by anisotropic etching the silicon oxide film on the side walls of the respective gate electrodes 206.

The anisotropic etching of the silicon oxide film 208 is carried out under the following condition in this embodiment.
Etching mode: RIE (Reactive Ion Etching) method
Processing gas: CHF+Ar
Flow rate of gas: CHF=50 sccm, Ar=100 sccm
Processing pressure: 5 mTorr
RF (13.56 MHz): 500 W
Temperature: 20° C.

Figure 11:
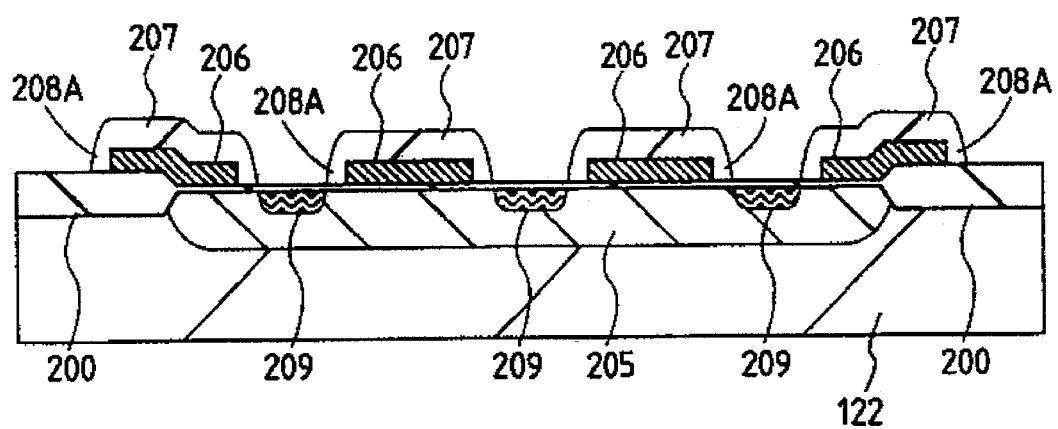
FIG. 11 is a sectional view of a principal part of the semiconductor wafer, illustrating the process for manufacturing a DRAM as an application of the present invention.

By the etching, an etching damage layer 209 is formed in the diffusion layer 205, as shown in FIG. 11. This etching damage layer 209 may cause leak defect etc.

Figure 12:
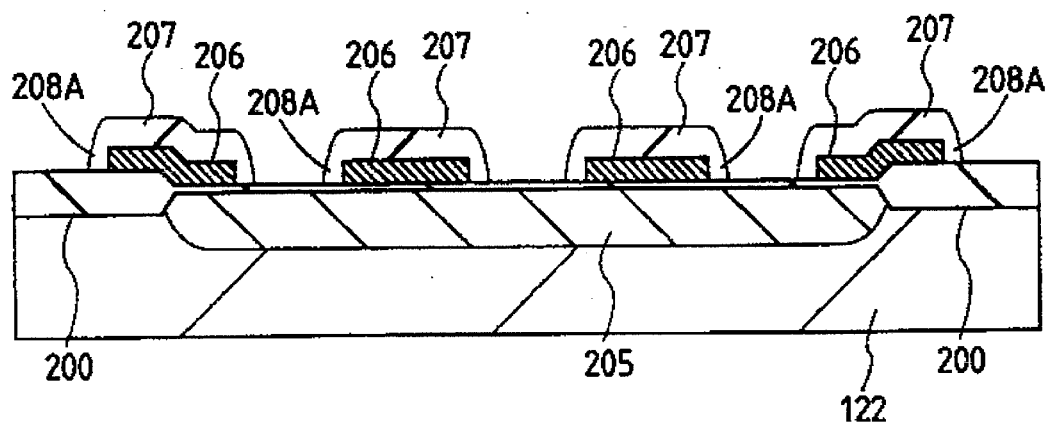
FIG. 12 is a sectional view of a principal part of the semiconductor wafer, illustrating the process for manufacturing a DRAM as an application of the present invention.

Next, the semiconductor water 122 is conveyed to the wet-rinsing/drying chamber 163 to remove the contaminating substances adhering to the surface, conveyed to the hydrogen eliminating chamber 104, where hydrogen elimination is carried out by the method as in Embodiments 1 and 2. FIG. 12 is a sectional view of a principal part of the semiconductor wafer 122 the damage of which has been corrected by the hydrogen elimination processing.

Figure 13:
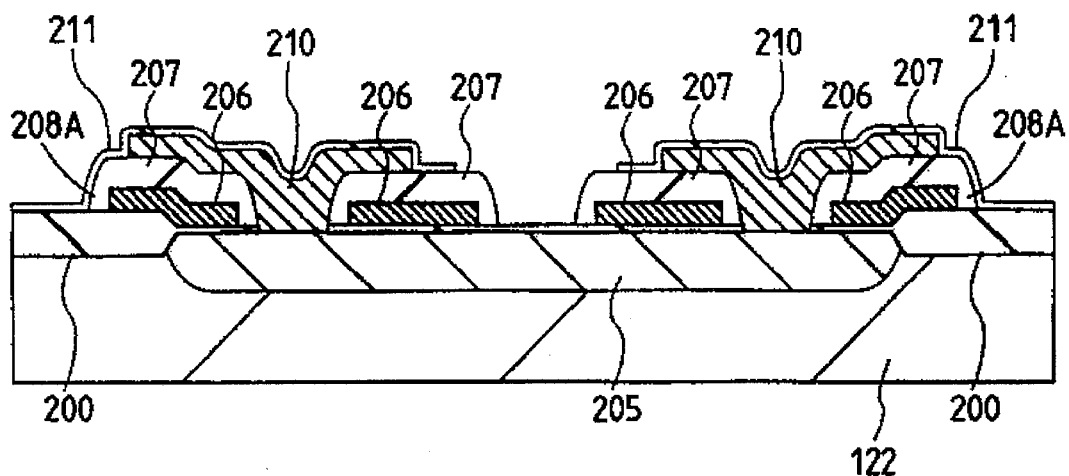
FIG. 13 is a sectional view of a principal part of the semiconductor wafer, illustrating the process for manufacturing a DRAM as an application of the present invention.

Subsequently, as shown in FIG. 13, a polycrystalline silicon film formed by CVD on the semiconductor wafer 122 is etched, an accumulation electrode 210 of a memory cell is formed, and a silicon oxide film 211 (specifically, an $SiO_2/Si_3N_4/SiO_2$ three-layer thin film) is deposited on the accumulation electrode 210 by CVD.

Figure 14:
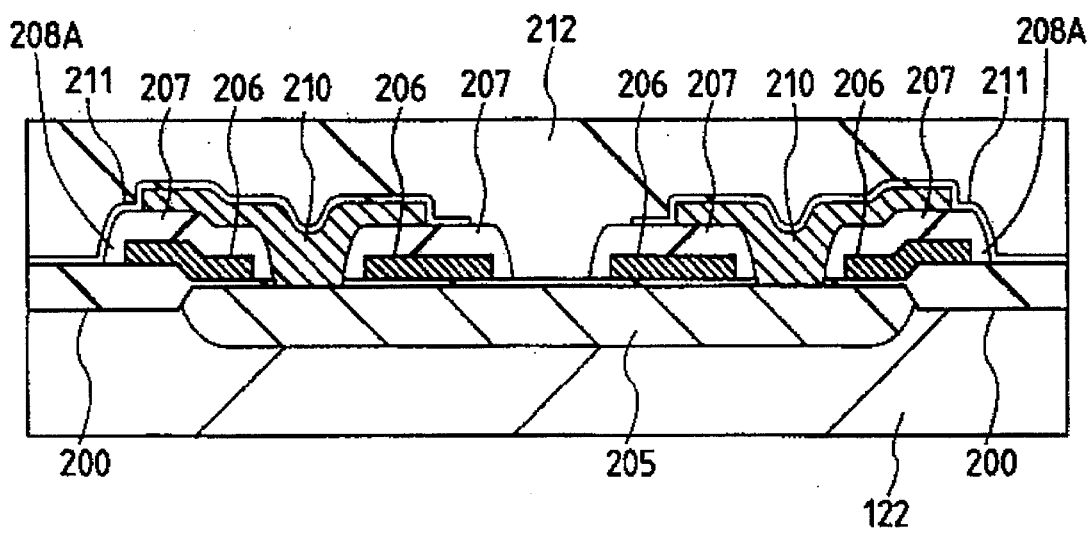
FIG. 14 is a sectional view of a principal part of the semiconductor wafer, illustrating the process for manufacturing a DRAM as an application of the present invention.

As shown in FIG. 14, an interlayer insulating film 212 is formed on the silicon oxide film 211. The interlayer insulating film 212 is made up of a silicon oxide film formed by CVD.

Figure 15:
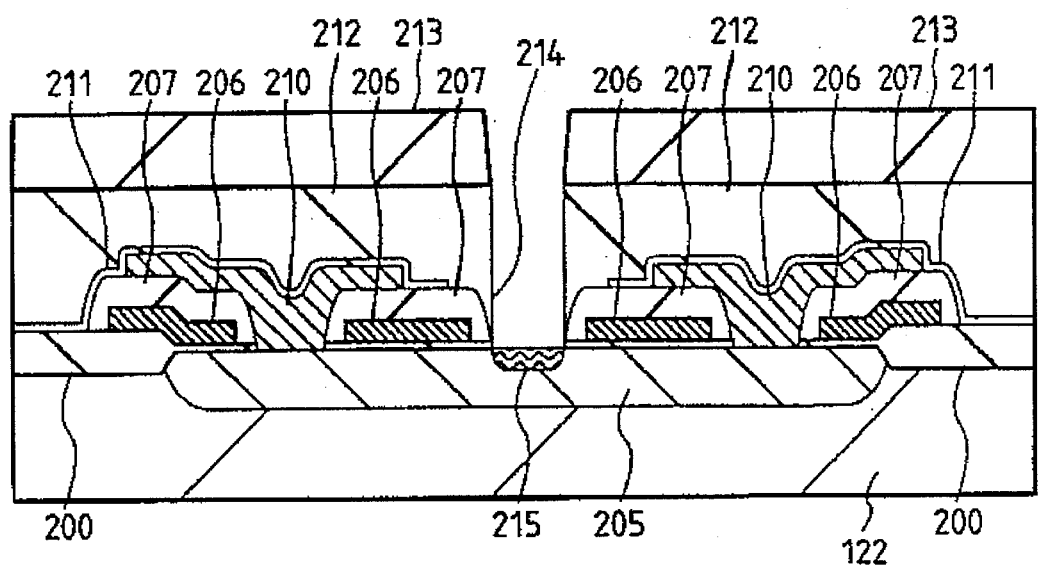
FIG. 15 is a sectional view of a principal part of the semiconductor wafer, illustrating the process for manufacturing a DRAM as an application of the present invention.

After a photoresist 213 to serve as an etching mask is formed on the interlayer insulating film 212, the semiconductor wafer 122 is conveyed to the plasma etching chamber 161 of the apparatus of the embodiment, where, as shown in FIG. 15, the interlayer insulating film 212 is etched to make a contact hole reaching the diffusion layer 205.
Etching mode: μ-wave ECR system
Processing gas: $CHF_3+CH_2F_2$
Flow rate of gas: $CHF_3$=25 sccm, $CH_2F_2$=25 sccm
Processing pressure: 2 mTorr
μ wave (2.45 G): 1.0 kW
RF (800 kHz): 300 W
Temperature: 0° C.

By the etching, an etching damage layer 209 is formed in the diffusion layer 205 as shown in FIG. 15.

Figure 16:
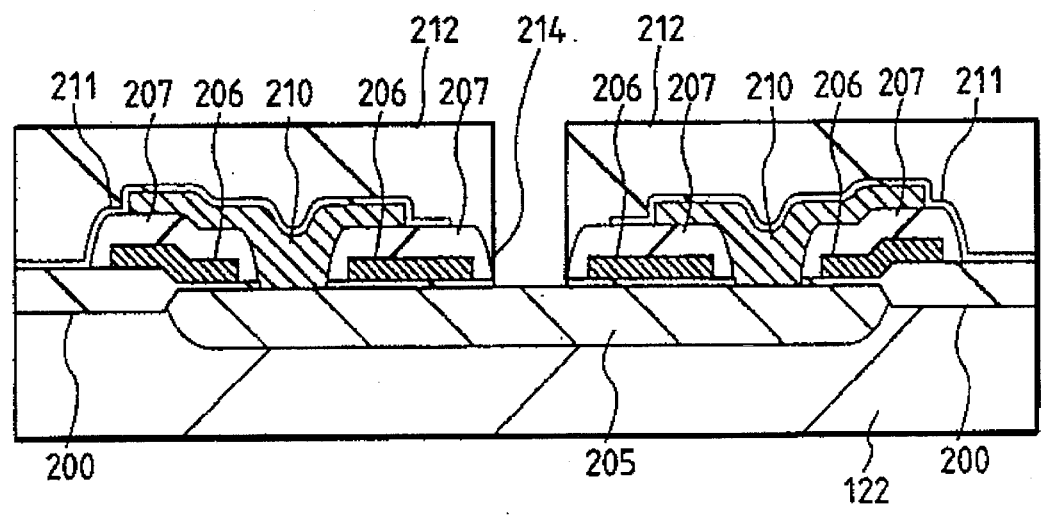
FIG. 16 is a sectional view of a principal part of the semiconductor wafer, illustrating the process for manufacturing a DRAM as an application of the present invention.

Subsequently, the semiconductor wafer 122 is conveyed to the ashing chamber 162 where a photoresist 213 is removed and then to wet rinsing/drying chamber 163 where contaminating substances adhering to the surface thereof are removed. Further, the semiconductor wafer 122 is conveyed to the chamber 104 for eliminating hydrogen where hydrogen is eliminated therefrom by the method described above (though no additional introduction of hydrogen is required in this case since hydrogen has already been introduced in the preceding etching process, the semiconductor wafer 122 may be processed in the chamber 162 for introducing hydrogen if hydrogen is insufficiently introduced therein in view of the other processes). FIG. 16 is a sectional view of the semiconductor wafer 122 whose damage has been removed by the process of eliminating hydrogen. If the aforementioned contamination is left as it is, an increase in contact resistance, leak defect and so forth may arise therefrom. Since low-temperature annealing process is performed to remove crystal defects caused by ion implantation or dry etching each time crystal defect is caused, such defects are prevented from cumulatively develop, and disorder of the depth and uniformity of the impurity diffusion due to the defects hardly occurs.

As shown in FIG. 16, there subsequently are performed the steps of introducing impurities into the contact portion, forming a first-layer Al wiring for making contact therewith, an interlayer insulating film thereon, a second-layer Al wiring, a final passivation film and the like in multilayer by a relatively high-temperature heat treatment.

Embodiment 3

An example of adaptation of the damage correcting method of the embodiment to the process of manufacturing bipolar transistors will be described below.

Figure 17:
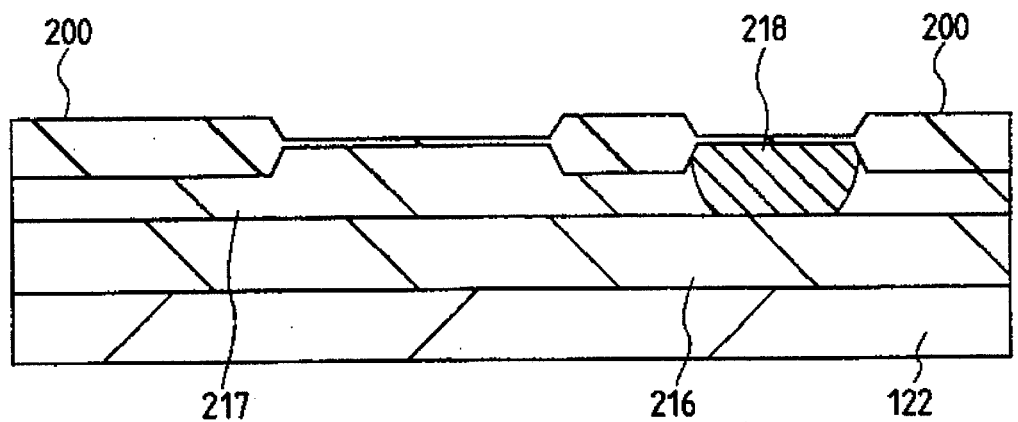
FIG. 17 is a sectional view of a principal part of a semiconductor wafer, illustrating an embodiment of a process for manufacturing a bipolar transistor according to the present invention.

As shown in FIG. 17, there are formed a buried diffusion layer 216 and an epitaxial layer 217, which constitute the collector region of a bipolar transistor, on the main surface of a semiconductor wafer 122. Then a diffusion layer 218 for leading out the collector is formed in a part of the epitaxial layer 217.

Figure 18:
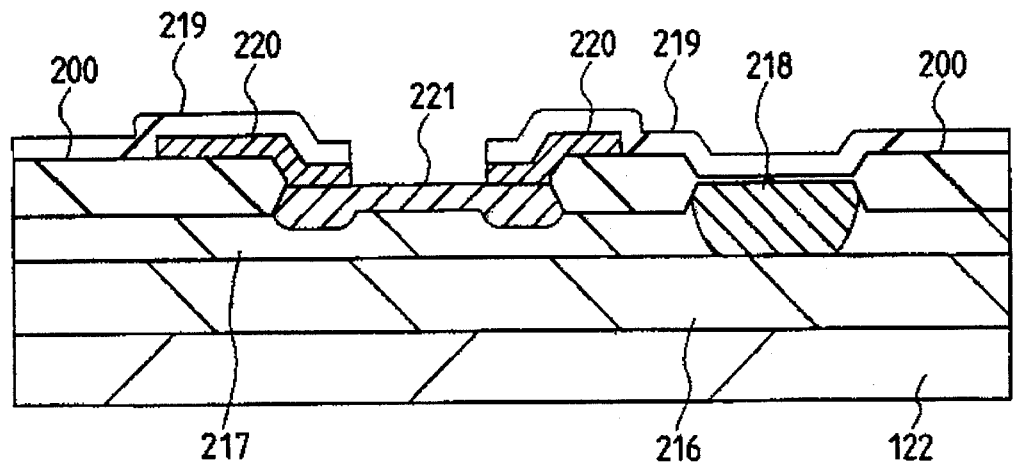
FIG. 18 is a sectional view of a principal part of a semiconductor wafer, illustrating the process for manufacturing a bipolar transistor according to the present invention.

As shown in FIG. 18, further, base lead-out electrodes 220 are formed on the semiconductor wafer 122 by patterning a polycrystalline silicon film and a silicon oxide film 219 that have been deposited by CVD thereon (the etching technique may be performed under the same condition as that of the silicon oxide film 208). Then the same processes of introducing and eliminating hydrogen as those referred to in Embodiment 2. Subsequently, impurity ions (e.g. P) are implanted into a part of the epitaxial layer 217 and the processes of introducing and eliminating hydrogen are followed as in the case of Embodiment 2, so that the impurities are so diffused as to form a base region 221 of the bipolar transistor. At this time, the impurities in the polycrystalline silicon film constituting the base lead-out electrode 220 are allowed to diffuse into a part of base region 221.

Figure 19:
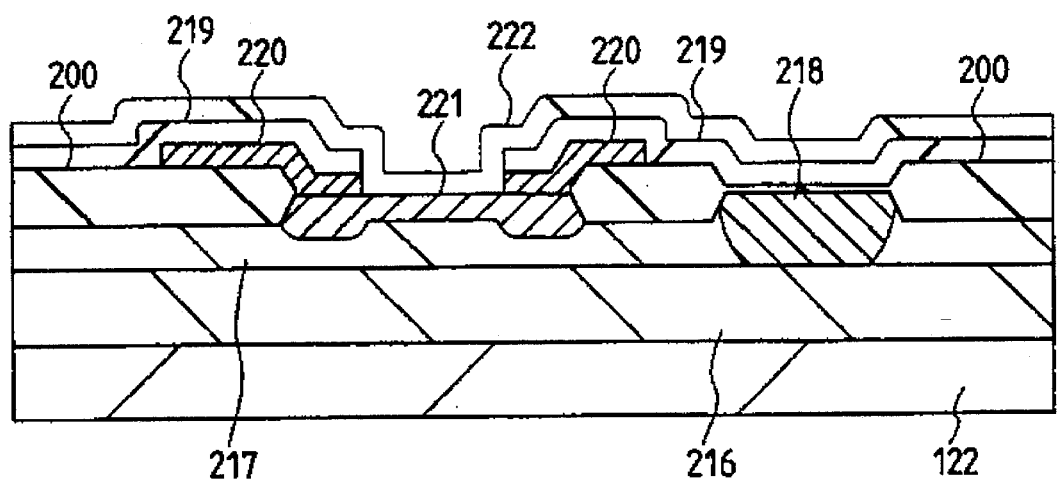
FIG. 19 is a sectional view of a principal part of a semiconductor wafer, illustrating the process for manufacturing a bipolar transistor according to the present invention.
Figure 20:
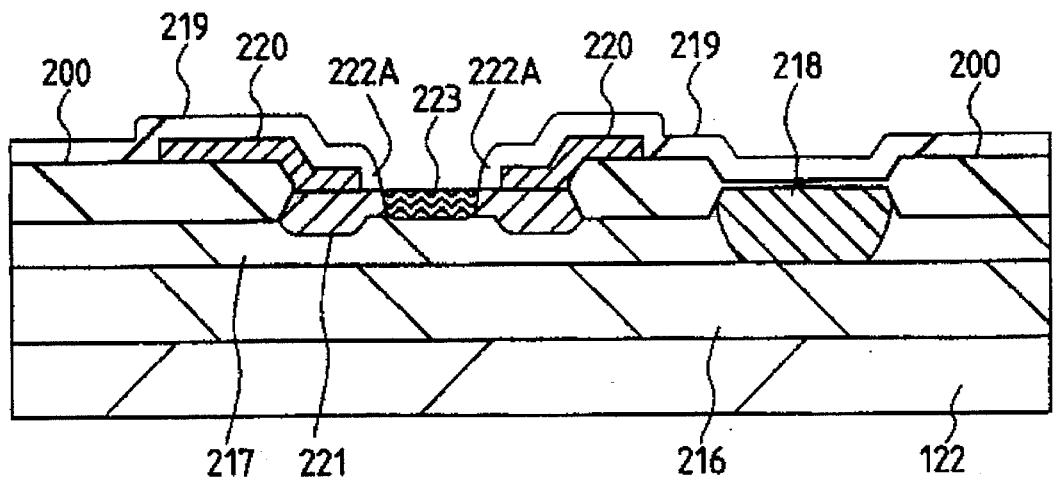
FIG. 20 is a sectional view of a principal part of a semiconductor wafer, illustrating the process for manufacturing a bipolar transistor according to the present invention.

As shown in FIG. 19, a silicon oxide film 22 is deposited by CVD on the surface of the semiconductor wafer 122, which is conveyed to the plasma-etching chamber 161 of the apparatus of the embodiment, where a silicon oxide film 222 is processed by anisotropic etching so as to form side wall spacers 222A on the side walls of base lead-out electrodes 220 and the silicon oxide films 219. The method and condition of etching the silicon oxide film 222 are the same as those of forming the side wall spacer (208A) on the side walls of the gate electrodes 206. This etching process can produce a etching damage layer 223 in the base region 221 as shown in FIG. 20.

Figure 21:
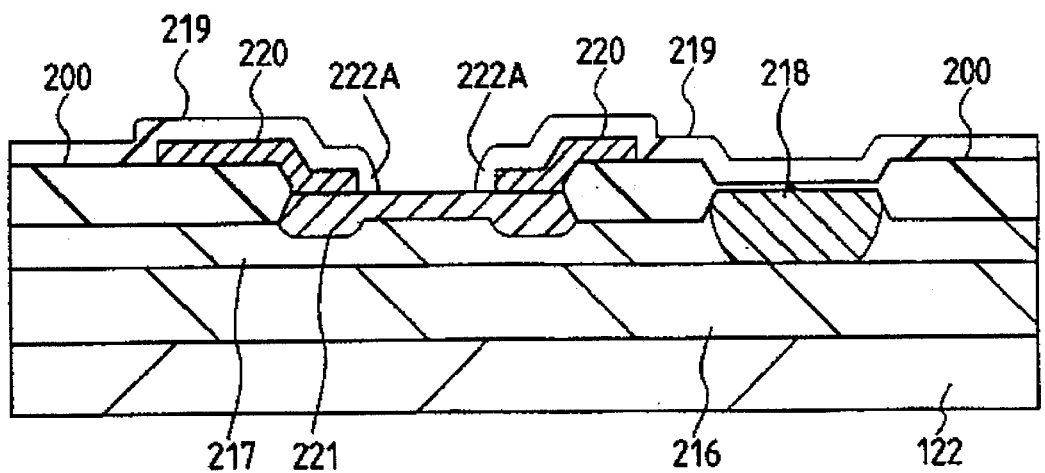
FIG. 21 is a sectional view of a principal part of a semiconductor wafer, illustrating the process for manufacturing a bipolar transistor according to the present invention.
Figure 22:
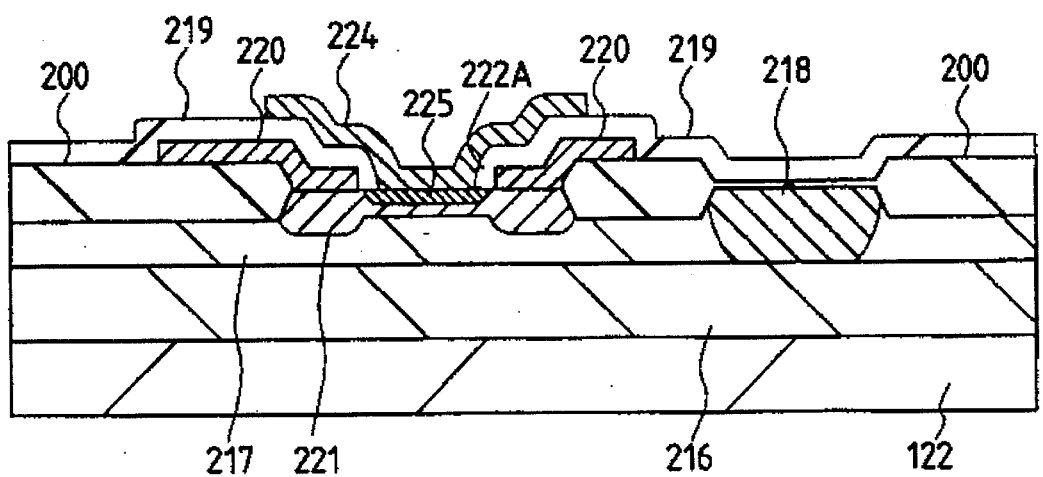
FIG. 22 is a sectional view of a principal part of a semiconductor wafer, illustrating the process for manufacturing a bipolar transistor according to the present invention.

Subsequently, the semiconductor wafer 122 is conveyed to the wet rinsing/drying chamber 163, where contaminating substances adhering to the surface are removed, and then the semiconductor wafer 122 is conveyed to the chamber 104 for eliminating hydrogen so as to be subjected to the hydrogen elimination in accordance with the aforementioned process. FIG. 21 is a sectional view of the semiconductor wafer 122 of which the damage has been removed by the hydrogen eliminating process. Then, as shown in FIG. 22, an emitter lead-out electrode 224 is formed by etching the polycrystalline silicon films deposited by CVD on the semiconductor wafer 122. The principal part of the bipolar transistor is thus completely formed by diffusing impurities in the polycrystalline silicon film into the surface of the base region 221 to form an emitter region 225. Further, there are subsequently formed a first-layer Al wiring layer and in addition, an interlayer insulation film, a second-layer Al wiring, a final passivation film and so forth in multilayer by a relatively high-temperature heat treatment.

A description will further be given of the hydrogen introduction/elimination process, described in reference to the embodiments 1, 2 and 3, in view of electrical technology.

Figure 23:
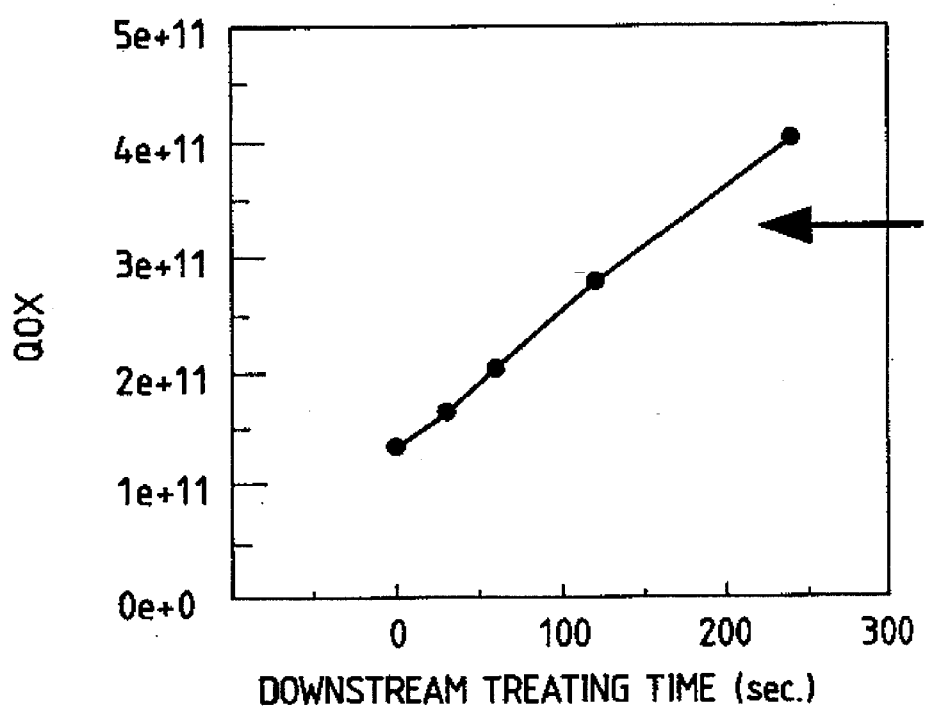
FIG. 23 is a graph showing the variation of the CV characteristic (charge quantity in an oxide silicon film) when hydrogen infiltrates into a normal silicon substrate.
Figure 24:
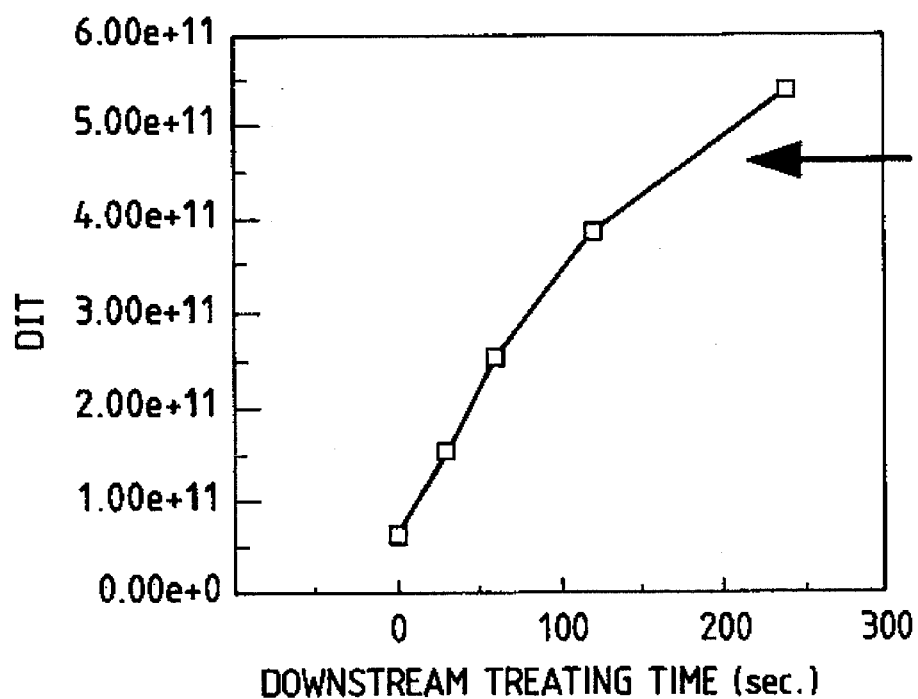
FIG. 24 is a graph showing the variation of the CV characteristic (oxide silicon film—interface state of silicon substrate) when hydrogen infiltrates into a normal silicon substrate.

FIGS. 23, 24 are graph showing variations of the CV characteristics when hydrogen infiltrates into a normal silicon substrate, wherein the abscissa axis in each drawing denotes processing time (sec.) in the chamber for introducing hydrogen, whereas the ordinate axis in FIG. 23 denotes the charge quantity in the silicon oxide film, and the ordinate axis in FIG. 24 the interface state between the silicon oxide film and the silicon substrate. It would be seen that the charge quantity and the interface state increase as the processing time elapses. Arrows in FIGS. 23 and 24 indicate the damage (FIG. 23) and charge (FIG. 24) quantities at the stage where the damage is caused after the dry etching process is performed.

Figure 25:
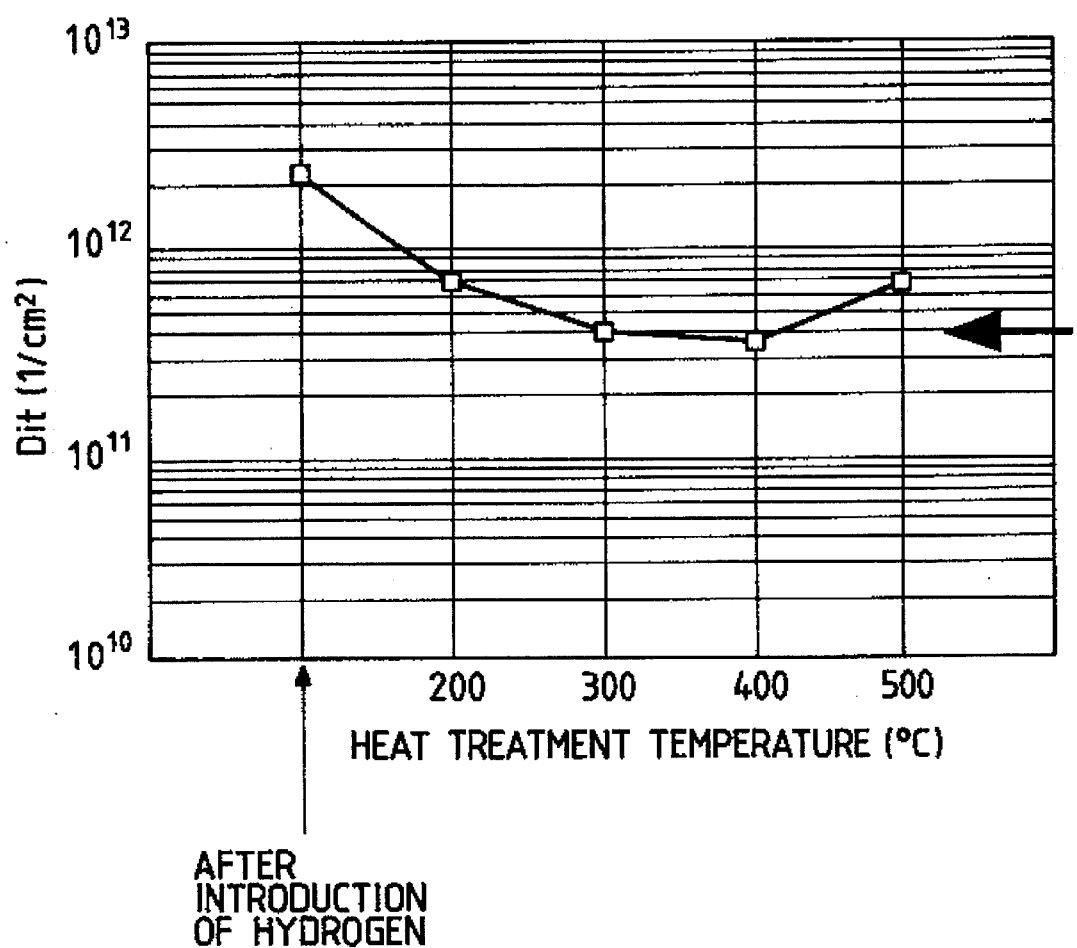
FIG. 25 is a graph showing the variation of the CV characteristic when a damaged silicon substrate is processed in the chamber for eliminating hydrogen.
Figure 26:
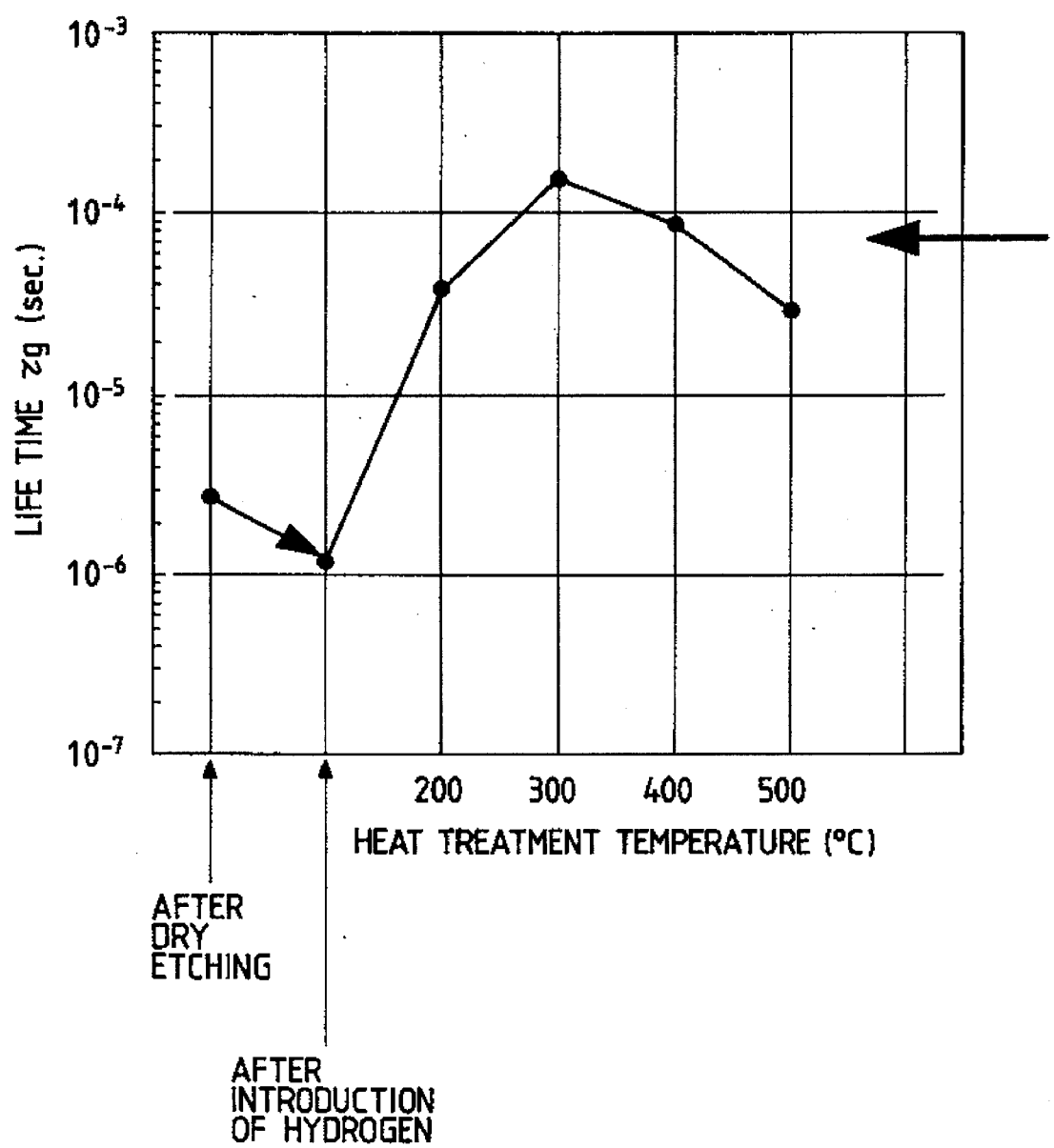
FIG. 26 is a graph showing the variation of the Ct characteristic when the damaged silicon substrate is processed in the chamber for eliminating hydrogen.

FIGS. 25 and 26 are graphs showing variations of the CV and Ct characteristics when silicon substrates suffering from damage are processed in the chamber for eliminating hydrogen, wherein the abscissa axis in each drawing denotes processing time (sec.) in the chamber for eliminating hydrogen, whereas the ordinate axis in FIG. 25 denotes the interface state between the silicon oxide film and the silicon substrate, and the ordinate axis in FIG. 26 the life time of the substrate. As the processing temperature rises, damage is corrected, thus indicating the presence of the optimum values in the temperature region of 200°–500° C. In addition, it would be also seen from the graph that each of the optimum values is better than those, shown by the arrow, of the silicon substrate that has not been processed by the introduction/elimination of hydrogen according to the present invention.

Although a detailed description has been given of the preferred embodiments of the present invention, the invention is, needless to say, not limited to such the embodiments thereof but may be modified in various manners without departing the spirit and scope of the invention.

Effect of the Invention

A brief description will subsequently be given of the effect of the invention by reference to the preferred embodiments thereof disclosed in this application.

According to the present invention, the process of manufacturing semiconductor integrated circuits comprises the steps of introducing hydrogen into semiconductor wafers without causing serious damage thereto and eliminating the hydrogen thus introduced into the semiconductor wafer at relatively low temperature in succession so as to remove the damage caused by plasma-etching and ion-implantation. Not only the reliability but also the yield rate of semiconductor integrated circuits to be produced can thus be improved.

What is claimed is:

1. A process for manufacturing semiconductor integrated circuits, comprising:

(a) a first step of performing a first processing that involves creating crystal defects in a first single crystal surface region of the main surface of an integrated circuit wafer in a first vacuum processing chamber;

(b) a first hydrogen introducing step of introducing hydrogen into the first single crystal surface region of the main surface of the integrated circuit wafer during or after the first processing without causing additional damage thereto;

(c) a first hydrogen eliminating step of eliminating, after steps (a) and (b), the hydrogen introduced in the first hydrogen introducing step from the first single crystal surface region thereof at low temperature to prevent doped impurities from diffusing undesirably, thereby eliminating the crystal defects introduced in step (a);

(d) a second step of performing a second processing that involves creating crystal defects in a second single crystal region of the main surface of the integrated circuit wafer in the first or second vacuum processing chamber, after step (c);

(e) a second hydrogen introducing step of introducing hydrogen into the second single crystal surface region of the main surface of the integrated circuit wafer, during or after the second processing substantially without causing additional damage thereto; and (f) a second hydrogen eliminating step of eliminating, after steps (d) and (e), the hydrogen introduced in the second hydrogen introducing step from the second single crystal surface region at low temperature to prevent doped impurities from diffusing undesirably, thereby eliminating the crystal defects introduced in step (d).

2. A process for manufacturing semiconductor integrated circuits as claimed in claim 1, wherein the first hydrogen introducing step is to supply hydrogen radicals to the integrated circuit wafer substantially at room temperature by a downstream system.

3. A process for manufacturing semiconductor integrated circuits as claimed in claim 2, wherein the hydrogen radicals are produced in a plasma using a mixture of hydrocarbon gas and oxygen gas for accelerating the decomposition of the hydrocarbon gas.

4. A process for manufacturing semiconductor integrated circuits as claimed in claim 1, wherein the first hydrogen eliminating step is to heat-treat the integrated circuit wafer in an atmosphere of inactive gas in a temperature range of 200°–500° C.

5. A process for manufacturing semiconductor integrated circuits as claimed in claim 1, wherein the first hydrogen eliminating step is to heat-treat the integrated circuit wafer in a vacuum in a temperature range of 200°–500° C.

6. A process for manufacturing semiconductor integrated circuits as claimed in claim 1, wherein the semiconductor wafer is irradiated with ultraviolet rays to accelerate the elimination of hydrogen when the hydrogen introduced into the integrated circuit wafer is eliminated in the first hydrogen eliminating step.

7. A process for manufacturing semiconductor integrated circuits, comprising:
   (a) a first step of a first ion implanting process that involves creating crystal defects in a first single crystal surface region of the main surface of an integrated circuit wafer;
   (b) a first hydrogen introducing step of introducing hydrogen into the first single crystal surface region of the main surface of the integrated circuit wafer after the first ion implanting process substantially without causing additional damage thereto;
   (c) a first hydrogen eliminating step of eliminating the hydrogen introduced in the first hydrogen introducing step from the first single crystal surface region thereof at low temperature to prevent impurities doped in the first ion implanting process from diffusing undesirably, after the first hydrogen introducing step, thereby eliminating the crystal defects created in step (a);
   (d) a second step of performing a second ion implanting process that involves creating crystal defects in a second single crystal region of the main surface of the integrated circuit wafer, after step (c);
   (e) a second hydrogen introducing step of introducing hydrogen into the second single crystal surface region of the main surface of the integrated circuit wafer, after the second ion implanting process substantially without causing additional damage thereto; and then
   (f) a second hydrogen eliminating step of eliminating the hydrogen introduced in the second hydrogen introducing step from the second single crystal surface region at low temperature to prevent impurities doped from diffusing undesirably, thereby eliminating the crystal defects created in step (d).

8. A process for manufacturing semiconductor integrated circuits as claimed in claim 7, wherein the integrated circuit wafer is wet-rinsed after the first ion implanting step.

9. A process for manufacturing semiconductor integrated circuits as claimed in claim 7, wherein when a photoresist mask is used in the first ion implanting step, the photoresist mask is removed by plasma ashing by a downstream system after the ions have been implanted.

10. A process for manufacturing semiconductor integrated circuits, comprising:
   (a) a first step of a first plasma-etching process under a processing gas atmosphere substantially with hydrogen, that involves creating crystal defects in a first single crystal surface region of the main surface of an integrated circuit wafer;
   (b) a first hydrogen introducing step of introducing hydrogen into the first single crystal surface region of the main surface of the integrated circuit wafer during the first plasma-etching process substantially without causing additional damage thereto;
   (c) a first hydrogen eliminating step of eliminating, after steps (a) and (b), the hydrogen introduced in the first hydrogen introducing step from the first single crystal surface region thereof at low temperature to prevent doped impurities from diffusing undesirably, thereby eliminating the crystal defects created in step (a);
   (d) a second step of performing a second plasma-etching process that involves creating crystal defects in a second single crystal region of the main surface of the integrated circuit wafer, after step (c);
   (e) a second hydrogen introducing step of introducing hydrogen into the second single crystal surface region of the main surface of the integrated circuit wafer, during the second plasma-etching process substantially without causing additional damage thereto; and
   (f) a second hydrogen eliminating step of eliminating, after steps (d) and (e), the hydrogen introduced in the second hydrogen introducing step from the second single crystal surface region at low temperature to prevent doped impurities from diffusing undesirably, thereby eliminating the crystal defects created in step (d).

11. A process for manufacturing semiconductor integrated circuits as claimed in claim 10, wherein the semiconductor wafer is wet-rinsed after the first plasma-etching step.

12. A process for manufacturing semiconductor integrated circuits as claimed in claim 10, wherein when a photoresist mask is used in the first plasma-etching step, the photoresist mask is removed by plasma ashing by a downstream system after the first plasma-etching step.

13. A process for manufacturing semiconductor integrated circuits, comprising:
   (a) a first step of a first plasma-etching process under a processing gas atmosphere substantially without hydrogen, that involves creating crystal defects in a first single crystal surface region of the main surface of an integrated circuit wafer;
   (b) a first hydrogen introducing step of introducing hydrogen into the first single crystal surface region of the main surface of the integrated circuit wafer after the first plasma-etching process substantially without causing additional damage thereto;
   (c) a first hydrogen eliminating step of eliminating the hydrogen introduced in the first hydrogen introducing step from the first single crystal surface region thereof at low temperature to prevent doped impurities from diffusing undesirably, after the first hydrogen introducing step, thereby eliminating the crystal defects created in step (a);
   (d) a second step of performing a second plasma-etching process that involves creating crystal defects in a second single crystal region of the main surface of the integrated circuit wafer, after step (c);

(e) a second hydrogen introducing step of introducing hydrogen into the second single crystal surface region of the main surface of the integrated circuit wafer, during or after the second plasma-etching process substantially without causing additional damage thereto; and (f) a second hydrogen eliminating step of eliminating, after steps (d) and (e), the hydrogen introduced in the second hydrogen introducing step from the second single crystal surface region at low temperature to prevent doped impurities from diffusing undesirably, thereby eliminating the crystal defects created in step (d).

14. A process for manufacturing semiconductor integrated circuits, comprising:

(a) a first step of performing a first processing that involves creating crystal defects by the damage caused by the impact of ions in a first portion of a single crystal surface region of the main surface of an integrated circuit wafer in a first vacuum processing chamber;

(b) a first hydrogen introducing step of introducing hydrogen into the first portion of the single crystal surface region of the main surface of the integrated circuit wafer in the first vacuum processing chamber or in a first chamber for introducing hydrogen during or after the first processing substantially without causing additional damage thereto;

(c) a first hydrogen eliminating step of eliminating, after steps (a) and (b), the hydrogen introduced in the first hydrogen introducing step from the single crystal surface region thereof at low temperature to prevent doped impurities from diffusing undesirably thereby eliminating the crystal defects created in step (a);

(d) a second step of performing a second processing that involves creating crystal defects by the damage caused by the impact of ions in the single crystal region of the main surface of the integrated circuit wafer in the first vacuum processing chamber or a second vacuum processing chamber, after the step (c);

(e) a second hydrogen introducing step of introducing hydrogen into the first portion of a second portion of the single crystal surface region of the main surface of the integrated circuit wafer in the vacuum processing chamber where the second process has been performed or in the first or second chamber for introducing hydrogen, during or after the second process substantially without causing additional damage thereto; and (f) a second hydrogen eliminating step of eliminating after steps (d) and (e), the hydrogen introduced in the second hydrogen introducing step from the single crystal surface region at low temperature to prevent doped impurities from diffusing undesirably, thereby eliminating the crystal defects created in step (d).

15. A process for manufacturing semiconductor integrated circuits, comprising:

(a) a first step of a plasma-etching process under a processing gas atmosphere substantially with hydrogen, that involves creating crystal defects in a first single crystal surface region of the main surface of an integrated circuit wafer;

(b) a first hydrogen introducing step of introducing hydrogen into the first single crystal surface region of the main surface of the integrated circuit wafer during the plasma-etching process substantially without causing additional damage thereto;

(c) a first hydrogen eliminating step of eliminating the hydrogen introduced in the first hydrogen introducing step from the first single crystal surface region thereof at low temperature to prevent doped impurities from diffusing undesirably, after steps (a) and (b), thereby eliminating the crystal defects created in step (a);

(d) a second step of performing an ion implanting process that involves creating crystal defects in a second single crystal region of the main surface of the integrated circuit wafer, after step (c);

(e) a second hydrogen introducing step of introducing hydrogen into the second single crystal surface region of the main surface of the integrated circuit wafer, after the second ion implanting process substantially without causing additional damage thereto; and then (f) a second hydrogen eliminating step of eliminating the hydrogen introduced in the second hydrogen introducing step from the second single crystal surface region at low temperature to prevent doped impurities from diffusing undesirably, thereby eliminating the crystal defects created in step (d).

16. A process for manufacturing semiconductor integrated circuits, comprising:

(a) a first step of a plasma-etching process under a processing gas atmosphere substantially without hydrogen, that involves creating crystal defects in a first single crystal surface region of the main surface of an integrated circuit wafer;

(b) a first hydrogen introducing step of introducing hydrogen into the first single crystal surface region of the main surface of the integrated circuit wafer after the plasma-etching process substantially without causing additional damage thereto;

(c) a first hydrogen eliminating step of eliminating the hydrogen introduced in the first hydrogen introducing step from the first single crystal surface region thereof at low temperature to prevent doped impurities from diffusing undesirably, after the hydrogen introducing step, thereby eliminating the crystal defects introduced in step (a);

(d) a second step of performing an ion implanting process that involves creating crystal defects in a second single crystaol region of the main surface of the integrated circuit wafer, after step (c);

(e) a second hydrogen introducing step of introducing hydrogen into the second single crystal surface region of the main surface of the integrated circuit wafer, after the second ion implanting process substantially without causing additional damage thereto; and then (f) a second hydrogen eliminating step of eliminating the hydrogen introduced in the second hydrogen introducing step from the second single crystal surface region at low temperature to prevent impurities doped in the ion implanting process from diffusing undesirably, thereby eliminating the crystal defects created in step (d).

17. A process for manufacturing semiconductor integrated circuits, comprising:

(a) a first step of an ion implanting process that involves creating crystal defects in a first single crystal surface region of the main surface of an integrated circuit wafer;

(b) a first hydrogen introducing step of introducing hydrogen into the first single crystal surface region of the main surface of the integrated circuit wafer after the ion implanting process substantially without causing additional damage thereto;

(c) a first hydrogen eliminating step of eliminating the hydrogen introduced in the first hydrogen introducing step from the first single crystal surface region thereof at low temperature to prevent impurities doped in the ion implanting process from diffusing undesirably, after the first hydrogen introducing step, thereby eliminating the crystal defects created in step (a);

(d) a second step of performing a plasma-etching process that involves creating crystal defects in a second single crystal region of the main surface of the integrated circuit wafer, after step (c);

(e) a second hydrogen introducing step of introducing hydrogen into the second single crystal surface region of the main surface of the integrated circuit wafer, during or after the plasma-etching process substantially without causing additional damage thereto; and (f) a second hydrogen eliminating step of eliminating, after steps (d) and (e), the hydrogen introduced in the second hydrogen introducing step from the second single crystal surface region at low temperature to prevent doped impurities from diffusing undesirably, thereby eliminating the crystal defects created in step (d).

* * * * *